(12) United States Patent
Jaiswal et al.

(10) Patent No.: US 10,964,367 B1
(45) Date of Patent: Mar. 30, 2021

(54) MRAM DEVICE COMPRISING RANDOM ACCESS MEMORY (RAM) AND EMBEDDED READ ONLY MEMORY (ROM)

(71) Applicant: GLOBALFOUNDRIES U.S. Inc., Santa Clara, CA (US)

(72) Inventors: Akhilesh Jaiswal, Ballston Spa, NY (US); Ajey Poovannummoottil Jacob, Watervliet, NY (US); Steven Soss, Cornwall, NY (US)

(73) Assignee: GLOBALFOUNDRIES U.S. INC., Santa Clara, CA (US)

( * ) Notice: Subject to any disclaimer, the term of this patent is extended or adjusted under 35 U.S.C. 154(b) by 0 days.

(21) Appl. No.: 16/778,548

(22) Filed: Jan. 31, 2020

(51) Int. Cl.
*G11C 11/16* (2006.01)
*H01L 27/22* (2006.01)

(52) U.S. Cl.
CPC ........ *G11C 11/161* (2013.01); *G11C 11/1655* (2013.01); *G11C 11/1657* (2013.01); *G11C 11/1659* (2013.01); *G11C 11/1673* (2013.01); *G11C 11/1675* (2013.01); *H01L 27/228* (2013.01)

(58) Field of Classification Search
None
See application file for complete search history.

(56) References Cited

U.S. PATENT DOCUMENTS

| | | |
|---|---|---|
| 9,129,691 B2 | 9/2015 | Khalili Amiri et al. |
| 9,552,859 B2 | 1/2017 | Roy et al. |
| 9,786,343 B1 | 10/2017 | DeBrosse |
| 2013/0215675 A1 | 8/2013 | Ryu et al. |
| 2013/0322161 A1* | 12/2013 | Noguchi ............. G11C 11/1673 365/158 |
| 2015/0043272 A1 | 2/2015 | Zhou et al. |
| 2018/0061467 A1 | 3/2018 | Kan et al. |
| 2019/0258482 A1 | 8/2019 | Jaiswal et al. |

OTHER PUBLICATIONS

Agrawal et al., "SPARE: Spiking Neural Network Acceleration Using ROM-Embedded RAMs as In-Memory-Computation Primitives," IEEE Transactions on Computers, 68:1190-1200, Aug. 2019.
Dorrance et al., "Diode-MTJ Crossbar Memory Cell Using Voltage-Induced Unipolar Switching for High-Density MRAM," IEEE Electron Device Letters, 34:753-55, Jun. 2013.
Jain et al., "Computing in Memory with Spin-Transfer Torque Magnetic RAM," arXiv:1703.021184v4 [cs.ET], Nov. 21, 2017.
Jaiswal et al., "In-situ, In-Memory Stateful Vector Logic Operations based on Voltage Controlled Magnetic Anisotropy," Scientific Reports, 8:5738, 2018.

(Continued)

*Primary Examiner* — James G Norman
(74) *Attorney, Agent, or Firm* — Yee Tze Lim; Hoffman Warnick LLC

(57) ABSTRACT

One illustrative MRAM device disclosed herein includes a first bit cell and a second bit cell. The first bit cell comprises a first access transistor and a first MTJ stack. The first MTJ stack comprises a first pinned layer and a first free layer, wherein the first pinned layer is connected to the first access transistor. The second bit cell comprises a second access transistor and a second MTJ stack. The second MTJ stack comprises a second pinned layer and a second free layer, wherein the second free layer is connected to the second access transistor.

10 Claims, 19 Drawing Sheets

(56) References Cited

OTHER PUBLICATIONS

Lee et al., "R-MRAM: A ROM-Embedded STT MRAM Cache," IEEE Electron Letters, 34:1256-58, Oct. 2013.
Noguchi et al., "Novel Voltage Controlled MRAM (VCM) with Fast Read/Write Circuits for Ultra Large Last Level Cache," IEDM16-675-78, 2016 IEEE.
Nozaki et al., "Recent Progress in the Voltage-Controlled Magnetic Anisotropy Effect and the Challenges Faced in Developing Voltage-Torque MRAM," Micromachines, 10:327, 2019.

* cited by examiner

MRAM DEVICE COMPRISING RANDOM ACCESS MEMORY (RAM) AND EMBEDDED READ ONLY MEMORY (ROM)

BACKGROUND

Field of the Invention

The present disclosure generally relates to various novel embodiments of a magnetic random access memory (MRAM) device that comprises random access memory (RAM) with embedded read only memory (ROM) and methods of making such a device.

Description of the Related Art

Traditionally, a computer's architecture has included (i) a processor unit, (ii) a memory unit, and (iii) other peripheral components. This architecture is often referred to as the von-Neumann architecture, after its inventor. This architecture is based on decoupling the memory from the processor. In general, the processor and the memory communicate via a data exchange bus. Such architecture is found in millions of computers worldwide. This architecture had proven to be very effective in advancing computer powers over the past several years.

However, in data intensive applications such as, for example, artificial intelligence, Internet-of-Things (IoT), advanced safety vehicles, etc., a relatively limited data transfer rate between the processor and the memory can be problematic. As a solution to the problems posed by the limited data transfer rate, researchers have been investigating and developing near-memory and in-memory computing solutions. One way to implement near-memory computing is by embedding ROM inside RAM. The ROM memory can serve as a look-up table for near-memory computing. An example of such near-memory computing is shown in U.S. Pat. No. 9,552,859 (the "Roy patent"). The Roy patent discloses an STT-MRAM device with embedded ROM that includes two separate bit lines. The free layer of the MTJ stack is coupled to one, but not both, of the two separate bit lines. However, the formation of two separate bit lines comes with an associated and undesirable area penalty if the access transistor width is not large enough. That is, for many state of the art MTJ based bit cells, the width of the access transistor of the bit cell is not large enough to accommodate the two separate bit lines. Thus, the use of two separate bit lines would require an increase in the width of the access transistor.

With respect to prior art in-memory computing devices and methods, such devices and methods have only been able to add in-memory computing ability within RAM data. Prior art devices also lack the ability to perform an in-memory computing operation with ROM data in conjunction with RAM data in a massively parallel manner. Moreover, with respect to state-of-the-art computing devices and methods, there are at least two major challenges which limits the data transfer rate between the processor and memory: (1) cycle time needed for data transfer (i.e., throughput); and (2) energy consumption associated with the data transfer. To combat these two drawbacks, one approach in the prior art is to utilize in-memory vector computations. In such cases, not only does the decoupled memory maintain data, it also provides rudimentary logic operations. In certain cases where the memory elements constituting the memory unit act both as memory storage primitives and also vector in-memory primitives they are termed as stateful memory primitives. These in-memory operations reduce the amount of data that is needed to be transferred between the memory unit and the processor and reduce energy consumption.

Typical in-memory technologies are based on MRAMs, resistive RAMs, and memory devices based upon phase change materials. As a requirement for retaining the data even during power-down cycles, one key desirable characteristic for memory elements is non-volatility. In particular, low leakage and non-volatility are desirable characteristics for memory storage devices. However, each of these in-memory technologies have their own associated limitations. For example, prior art in-memory computing devices, STT-MRAM devices, involved placement of modified read circuits within the memory array to directly read a bitwise Boolean logic data by activating multiple rows of the array. In general, such multi-row activation, especially with STT-MRAMs, resulted in poor sensing margins. In addition, where multiple cascaded Boolean operations are needed, such prior art STT-MRAM based memory arrays would require a memory read operation for each bit-wise Boolean operation, thereby leading to lower throughput and higher energy consumption. Mem-resistive devices present challenges from efficiency perspective and suffers from limited lifecycle and material endurance.

The present disclosure is generally directed to various novel embodiments of an MRAM device that comprises RAM with embedded ROM that may solve or at least reduce one or more of the problems identified above.

SUMMARY

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various novel embodiments of an MRAM device that comprises RAM with embedded ROM. One illustrative MRAM device disclosed herein comprises a first bit cell and a second bit cell. The first bit cell comprises a first access transistor and a first MTJ stack. The first MTJ stack comprises a first pinned layer and a first free layer, wherein the first pinned layer is connected to the first access transistor. The second bit cell comprises a second access transistor and a second MTJ stack. The second MTJ stack comprises a second pinned layer and a second free layer, wherein the second free layer is connected to the second access transistor.

BRIEF DESCRIPTION OF THE DRAWINGS

The disclosure may be understood by reference to the following description taken in conjunction with the accompanying drawings, in which like reference numerals identify like elements, and in which.

Figure 1:
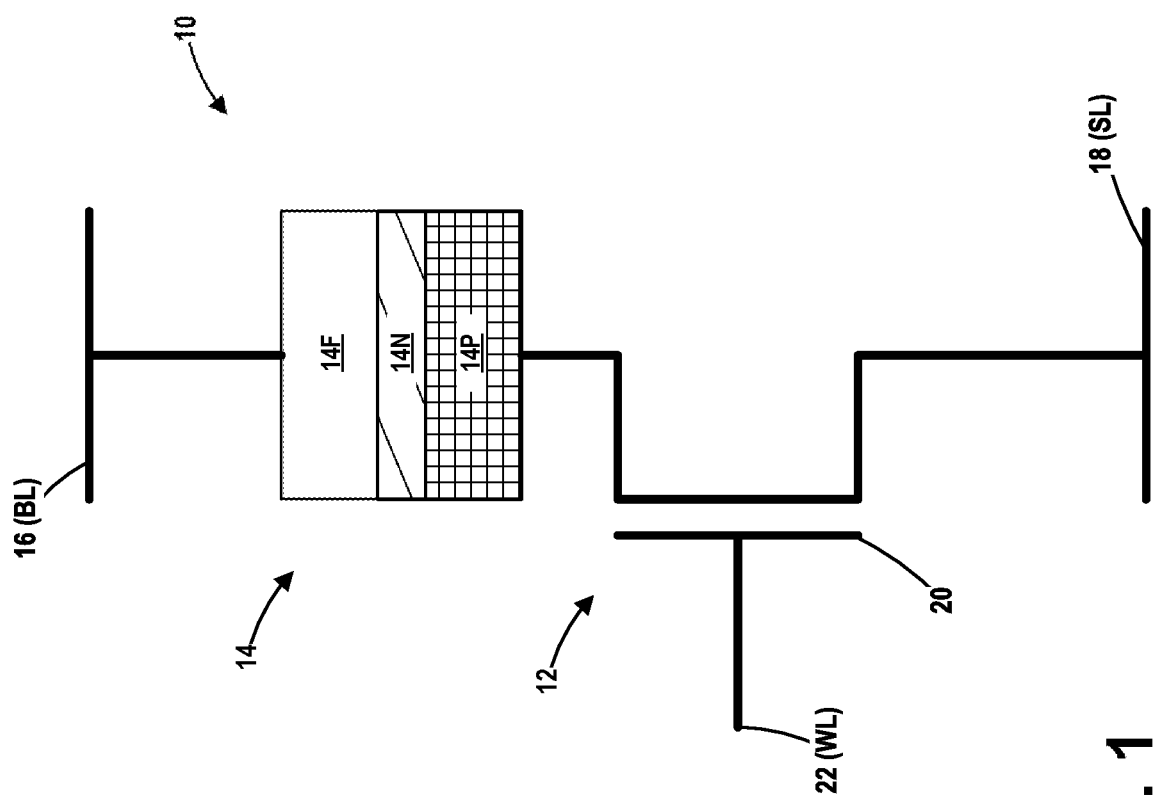
FIGS. 1-19 depict various novel embodiments of an MRAM device that comprises RAM with embedded ROM and methods of making such an MRAM device.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

As will be readily apparent to those skilled in the art upon a complete reading of the present application, the various embodiments of the MRAM device disclosed herein may be incorporated into any type of integrated circuit product, e.g., it may be a stand-alone memory product, a product when memory circuits are embedded with logic circuits, etc. With reference to the attached figures, various illustrative embodiments of the methods and devices disclosed herein will now be described in more detail.

FIGS. 1-19 depict various novel embodiments of an MRAM device that comprises RAM with embedded ROM and various methods of making such an MRAM device. In the illustrative example disclosed herein, the MRAM device will be based upon voltage controlled magnetic anisotropy (VCMA) MRAM. However, as will be appreciated by those skilled in the art after a complete reading of the present application, the subject matter disclosed herein is not limited to VCMA-MRAM devices. Rather, other forms of MRAM may be configured and used as described herein.

FIG. 1 depicts a typical magnetic read access memory (MRAM) bit cell 10. In this illustrative example, the MRAM bit cell 10 includes an access transistor 12 and a magnetic tunnel junction (MTJ) stack 14. The MTJ stack 14 comprises a ferromagnetic pinned layer 14P (which has a fixed magnetic orientation) and a ferromagnetic free layer 14F (whose magnetic orientation can be switched) that are separated by a non-magnetic layer 14N, e.g., a tunneling oxide layer comprised of, for example, magnesium oxide, silicon dioxide, etc. The MTJ stack 14 is positioned between a high side bit line (BL) node 16 and the access transistor 12. The access transistor 12 is positioned between the MTJ stack 14 and a source line (SL) node 18. The access transistor is controlled by a gate 20 that is connected to a word line (WL) node 22.

The logic state stored in the bit cell 10 depends on the relative orientation between the magnetic vector of the free layer 14F and the magnetic vector of the pinned layer 14P. The relative orientation between the magnetic vectors of free layer 14F and the pinned layer 14P may have either a parallel orientation (designated by the letter "P") or an antiparallel orientation (designated by the letters "AP"). In the parallel orientation (P), the magnetic vector orientation of both the free layer 14F and the magnetic vector orientation of the pinned layer 14P are substantially the same. In the antiparallel orientation (AP), the magnetic vector orientation of the free layer 14F and the magnetic vector orientation of the pinned layer 14P are opposite one another. When the MTJ stack 14 is in the parallel orientation state, the MTJ stack 14 is in a relatively low resistance state. Conversely, when the MTJ stack 14 is in the antiparallel state, the MTJ stack 14 is in a relatively high resistance state. In one illustrative embodiment, the parallel orientation of the MTJ stack 14 may represent a logical "0" while the antiparallel orientation of the MTJ stack 14 may represent a logical "1." The critical current ($I_C$) of the MTJ stack 14 is the current that can cause the free layer 14F to switch from one orientation to another.

Two operations are of importance: a read operation and a write operation. A read operation involves activating the gate 20 of the access transistor 12 via the word line (WL) node 22 and applying a bias voltage ($V_{READ}$) between the BL node 16 and the SL node 18. The resulting read current through the MRAM bit cell 10 is thus compared against a global reference current to determine the logic state stored. A write operation is performed by passing a current greater than the critical switching current ($I_C$) of the MTJ stack 14 for a minimum switching duration. The current direction to write a "1" vs. a "0" differs based on the logic value to be written into the MRAM bit cell 10. A read operation requires a relatively smaller current (i.e., much smaller than the critical switching current) to be passed through the MRAM bit cell 10. The read operation can also be accomplished based on a voltage-based sensing scheme, wherein a small known current is applied to the BL node 16 and resistance across the MRAM bit cell 10 is measured and compared to a reference voltage ($V_{REF}$). The reference voltage ($V_{REF}$) is a voltage lower than the voltage associated with the high resistance state of the MTJ stack 14 and higher than the voltage associated with the low resistance state of the MTJ stack 14. A higher resistance represents a "1"—representing antiparallel orientation—while a lower resistance represents a "0"—representing parallel orientation. For STT-MRAM devices, the higher resistance value for the antiparallel state may be about 10 kohms, while the lower resistance value for the parallel state may be about 3 kohms. For MRAMs based upon VCMA techniques, the higher resistance value for the antiparallel state may be about 30-45 kohms, while the lower resistance value for the parallel state may be about 10-15 kohms. The read operation can also be accomplished based on a current-based sensing technique, wherein a small voltage is applied across the MRAM bit cell 10 and the current through the MRAM bit cell 10 is measured, where a relatively large current represents a "0"—representing a parallel orientation, and a relatively small current represents a "1"—an antiparallel orientation. The opposite convention could also be used if desired, i.e., a "1" could represent parallel orientation while a "0" could represent antiparallel orientation.

The magnetic orientation of the MTJ stacks 14 disclosed herein may be switched between parallel and antiparallel orientation, and vice-versa, by using well-known voltage controlled magnetic anisotropy (VCMA) precessional switching techniques, wherein the switching voltage or pulse is applied only for a pre-determined period of time. The VMCA precessional switching technique involves making use of the VCMA effect (and particularly the voltage asymmetry of the VCMA) to lower the energy barrier (EB) of the MTJ stack 14, thereby making switching easier (when the MTJ stack 14 is in the parallel state) and reducing the current required for a write operation. The VMCA precessional switching technique takes advantage of the precessional dynamics of the VCMA process whereby the current required for switching can, in principle, be eliminated. In the VCMA-precessional switching techniques, the MTJ stack 14 is subjected to a voltage of a certain polarity and for an appropriate amount of time to allow reversal of the magnetic polarization of the nanomagnet about a hard axis (the axis in the plane of the magnet) to thereby switch the MTJ stack 14. The precessional switching approach is further discussed in US published patent application 2019/0258482 which is hereby incorporated by reference in its entirety.

Figure 2:
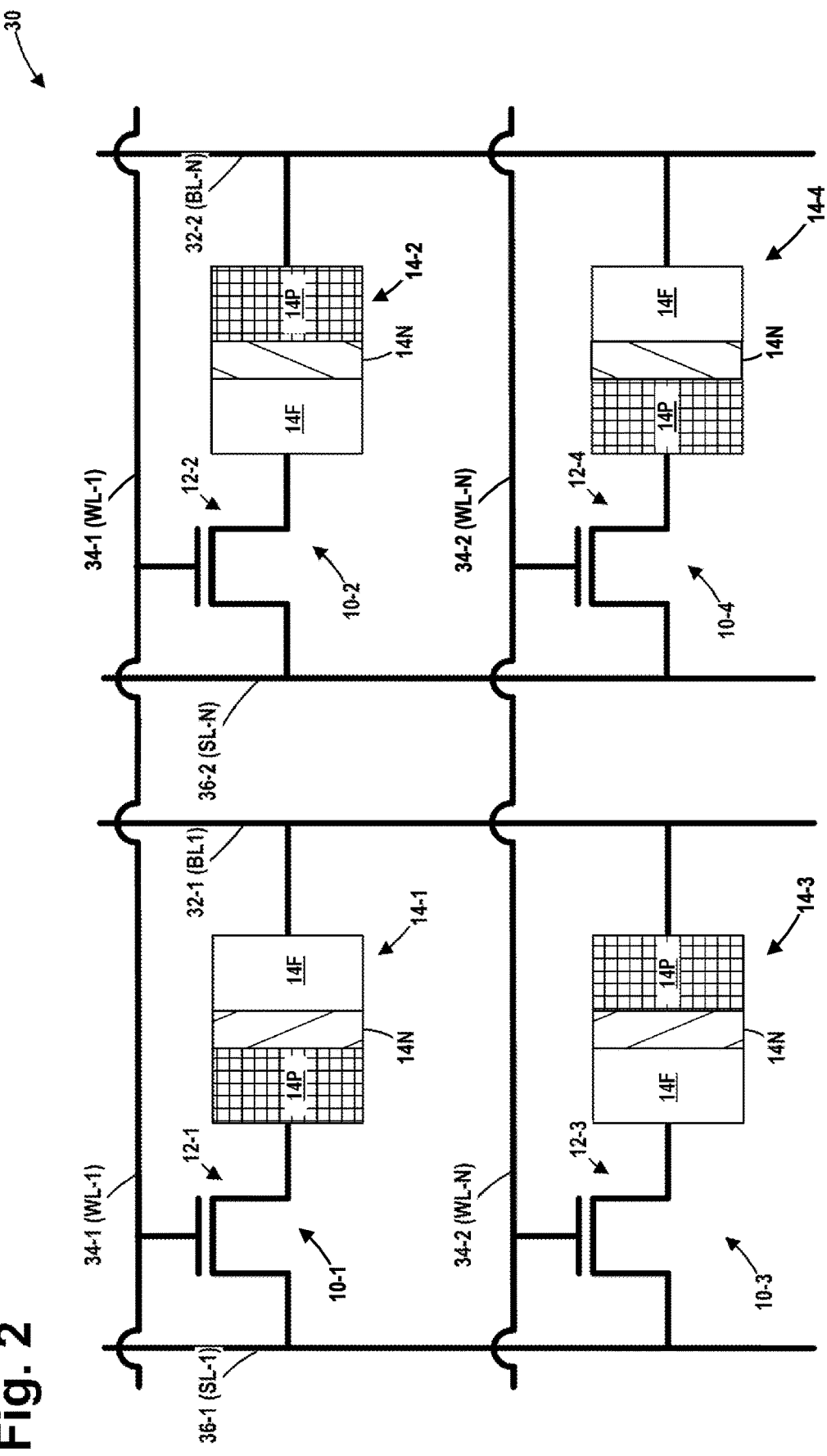

FIG. 2 depicts a portion of an illustrative MRAM array 30. Depicted therein are four bit cells that are labeled 10-1 through 10-4 for ease of reference (collectively referenced using the numeral 10). The MTJ stack 14 of each of the bit cells 10 has also been identified with the reference numbers 14-1 through 14-4 for ease of reference (collectively referenced using the numeral 14). The access transistor 12 for each of the bit cells 10 has also been identified with the reference numbers 12-1 through 12-4 for ease of reference (collectively referenced using the numeral 12). Also depicted are a plurality of word lines 34-1, 34-2 (WL-1, WL-N), a plurality of bit lines 32-1, 32-2 (BL-1, BL-N) and a plurality of source lines 36-1, 36-2 (SL-1, SL-2).

With continued reference to FIG. 2, note that the physical orientation of the MTJ stack 14 in each of the bit cells 10 is not uniform relative to other components of the bit cell 10. For example, for the bit cells 10-1 and 10-4, the pinned layer 14P of the MTJ stacks 14-1, 14-4, respectively, is connected to the access transistor 12-1, 12-4, respectively, while the free layer 14F of the MTJ stacks 14-1, 14-4, respectively, is connected to the bit lines 32-1, 32-2, respectively. Conversely, for the bit cells 10-2 and 10-3, the free layer 14F of the MTJ stacks 14-2, 14-3, respectively, is connected to the access transistor 12-2, 12-3, respectively, while the pinned layer 14P of the MTJ stacks 14-2, 14-3, respectively is connected to the bit lines 32-2, 32-1, respectively. Also note that the pinned layer 14P of the free layer 14F (depending upon the particular bit cell) is connected to only a single bit line 32. As will be appreciated by those skilled in art after a complete reading of the present application, each bit cell 10 is capable of storing both RAM data and ROM data. More specifically, using the novel devices and methods disclosed herein, RAM data will be stored internally within the MTJ stack 14 while ROM data will be stored in the connection between the access transistor 12 and the MTJ stack 14.

As will be appreciated by those skilled in the art after a complete reading of the present application, the MRAM array 30 disclosed herein has a unique structure and configuration relative to various prior art MRAMs. For example, in conventional MRAMs, the pinned layer and the free layer of the MTJ stack always exhibited a uniform connection pattern. For example, throughout such prior art arrays, the pinned layer in each bit cell was always connected to the access transistor and the free layer in the bit cell was always connected to the bit line, or vice-versa. In contrast, in the MRAM array 30 disclosed herein, depending upon the particular bit cell 10, either the pinned layer 14P or the free layer 14F of the MTJ stack 14 may be connected to the access transistor 12. Stated another way, the MRAM array 30 disclosed herein comprises a first plurality of bit cells where the pinned layer 14P is connected to the access transistor 12 and a second plurality of bits cells where the free layer 14F is connected to the access transistor 12. That is, in the first plurality of bit cells, the memory element, e.g., the MTJ stack 14, is oriented or positioned in a first configuration or orientation relative to other structures of the bit cell, such as the access transistor 12, while, in the second plurality of bit cells, the memory element, e.g., the MTJ stack 14, is oriented or positioned in a second configuration or orientation relative to other structures of the bit cell, such as the access transistor 12, wherein the second configuration of the memory element is opposite to the first configuration of the memory element.

When it is stated herein and in the attached claims that the pinned layer 14P is connected to the bit line 32, it means that the pinned layer 14P of the MTJ stack 14 is positioned between the bit line 32 and the non-magnetic layer 14N of the MTJ stack 14. When it is stated herein and in the attached claims that the pinned layer 14P is connected to the access transistor 12, it means that the pinned layer 14P of the MTJ stack 14 is positioned between the access transistor 12 and the non-magnetic layer 14N of the MTJ stack 14. Similarly, when it is stated herein and in the attached claims that the free layer 14F is connected to the bit line 32, it means that the free layer 14F of the MTJ stack 14 is positioned between the bit line 32 and the non-magnetic layer 14N of the MTJ stack 14. Lastly, when it is stated herein and in the attached claims that the free layer 14F is connected to the access transistor 12, it means that the free layer 14F of the MTJ stack 14 is positioned between the access transistor 12 and the non-magnetic layer 14N of the MTJ stack 14.

Additionally, depending upon the particular bit cell 10, the pinned layer 14P or the free layer 14F (as the case may be) of the MTJ stack 14 is connected to only a single bit line 32, thereby reducing the overall "foot-print" of the array 30. The pinned layer 14P and the fixed layer 14F of the MTJ stacks disclosed herein may be made of any ferromagnetic material and they need not be formed of the same ferromagnetic material, but that may be the case in some applications. The pinned layer 14P and the fixed layer 14F may be formed to any desired thickness, and the thickness of the pinned layer 14P and the fixed layer 14F need not be the same, e.g., the free layer 14F may be thinner than the pinned layer 14P. The non-magnetic layer 14N may be formed using any non-magnetic material, e.g., magnesium oxide, aluminum oxide, and it may be formed to any desired thickness, e.g., between about 1.3 nm and about 1.5 nm.

Figure 3:
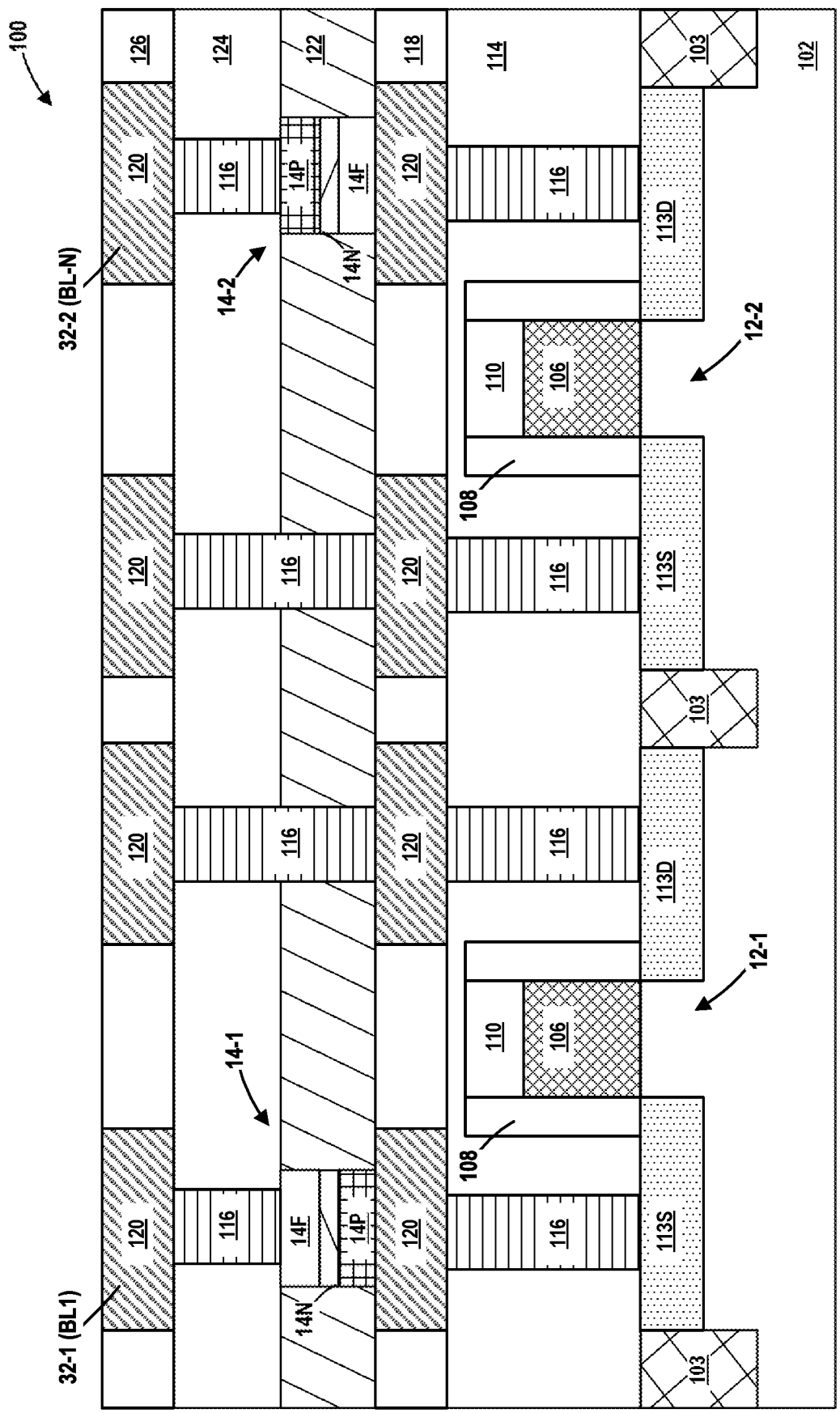

The MRAM array 30 may come in a variety of different physical configurations and arrangements and it may be fabricated by performing a variety of known manufacturing techniques. FIG. 3 depicts one illustrative example of a portion of an illustrative MRAM array 30 disclosed herein that is formed on an integrated circuit product 100 wherein the MTJ stacks 14-1, 14-2 of the bit cells 10-1, 10-2, respectively, are shown in cross section. The MRAM array 30 may be formed above a semiconductor substrate 102. The substrate 102 may have a bulk configuration (as depicted in FIG. 3) or a semiconductor-on-insulator configuration (not shown) that includes a base semiconductor layer, a buried insulation layer (e.g., silicon dioxide), and an active layer (e.g., silicon), wherein the MRAM array 30 would be formed in and above the active layer. The substrate 102 may be made of silicon or it may be made of semiconductor materials other than silicon and it may be formed to any desired thickness. Thus, the terms "substrate" or "semiconductor substrate" should be understood to cover all semiconductor materials and all forms of such semiconductor materials.

FIG. 3 depicts the MRAM array 30 after several process operations were performed. First, isolation regions 103 were formed in the substrate 102. Thereafter, the access transistors 12-1 and 12-2 were formed by performing traditional manufacturing techniques. Each of the access transistors 12 comprise a simplistically depicted final gate structure 106, a sidewall spacer 108, a gate cap 110, a source region 113S and a drain region 113D (collectively referenced using the numeral 113). The final gate structure 106 for the access transistors 12 may be formed by performing well-known gate-first or replacement-gate manufacturing techniques. The final gate structure 106 normally comprises a gate insulation layer (not separately shown), such as silicon dioxide or a high-k (k value greater than 10) insulating material, and one or more layers of conductive material (not separately shown) that act as the gate electrode, e.g., a metal, a metal alloy, titanium nitride, tantalum nitride, tungsten, aluminum, polysilicon, etc. The source/drain regions 113 may be formed by performing known ion implantation techniques. Additionally, the source/drain regions 113 may also contain regions of doped epitaxial semiconductor material (not shown). The access transistors 12 may be either N-type or P-type devices, and they may come in any of a variety of different configurations, i.e., the access transistors 12 may be planar devices, FinFET devices, vertical devices, etc. In the illustrative examples depicted herein, the access transistors 12 are depicted as being planar devices.

Also depicted in FIG. 3 are a plurality of illustrative conductive vias 116 and conductive lines 120 that are positioned in various layers of insulating material 114, 118, 122, 124 and 125. As will be appreciated by those skilled in the art, the various layers of insulating material shown in FIG. 3 are intended to be representative of any of a variety of combinations of insulating materials and etch stop layers that may be comprised of any of a variety of different materials, e.g., silicon dioxide, a low-k material, silicon nitride, etc., and these layers of insulating material may be formed to any desired thickness. The conductive vias 116 and the conductive lines 120 are also intended to be representative in nature and they may be formed by performing a variety of known manufacturing techniques. The conductive vias 116 and the conductive lines 120 may also contain one or more barrier layers (not depicted).

As depicted in FIG. 3, for the MTJ stack 114-1, the pinned layer 14P is positioned vertically below the free layer 114F, the free layer 14F is connected to the bit line 32-1, and the MTJ stack 14-1 is, in this example, connected to the source region 113S of the access transistor 12-1. However, in other configurations, the MTJ stack 14-1 could be connected to the drain region 113D of the access transistor 12-1. The word line connections to each of the gate structures 106 of the access transistors 12-1 and 12-2 are not depicted in the cross-sectional view shown in FIG. 3.

As further depicted in FIG. 3, for the MTJ stack 14-2, the free layer 14F is positioned vertically below the pinned layer 14P, the pinned layer 14P is connected to the bit line 32-2, and the MTJ stack 14-2 is, in this example, connected to the drain region 113D of the access transistor 12-2. However, in other configurations, the MTJ stack 14-2 could be connected to the source region 113S of the access transistor 12-2. In the example shown in FIG. 3, the MTJ stacks 14-1, 14-2 are formed in the same level, i.e., in the level containing the insulating material 122.

Figure 4:
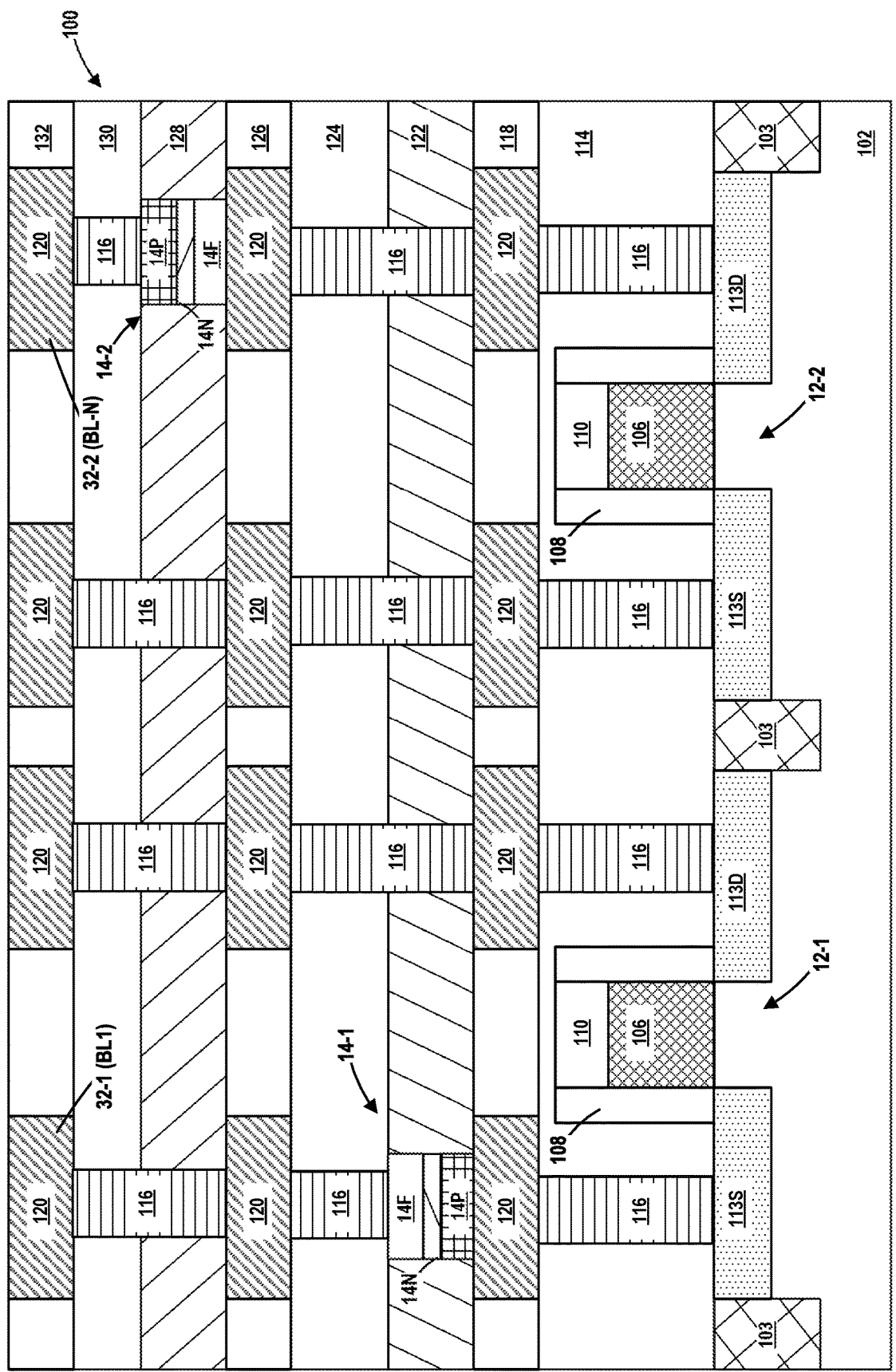

FIG. 4 depicts another possible configuration of the MRAM array 30 wherein the MTJ stacks 14-1, 14-2 are formed at different levels of the product 100. Additional representative layers of insulating material 126, 128, 130 and 132 are shown in FIG. 4. In this example, the MTJ stack 14-1 is formed in the level that includes the insulating material 122, while the MTJ stack 14-2 is formed in the level that includes the insulating material 128. Also note that, in the embodiment shown in FIG. 4, as was the case for the embodiment shown in FIG. 3, for the MTJ stack 14-1, the pinned layer 14P is positioned vertically below the free layer 14F and the free layer 14F is connected to the bit line 32-1, while for the MTJ stack 14-2, the free layer 14F is positioned vertically below the pinned layer 14P and the pinned layer 14P is connected to the bit line 32-2.

Figure 5:
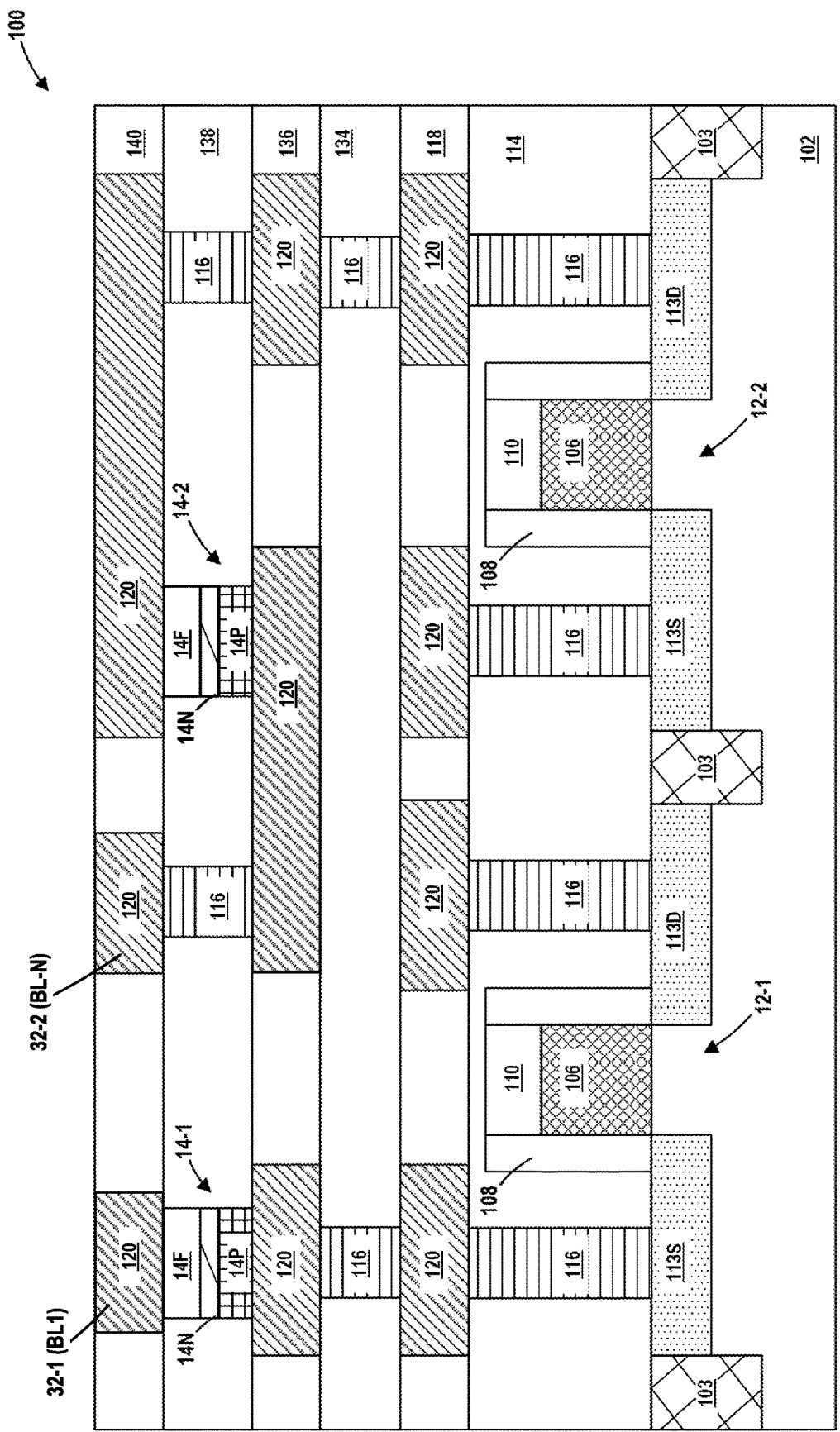

FIG. 5 depicts another possible configuration of the MRAM array 30 wherein the MTJ stacks 14-1, 14-2 are formed on the same level within the product 100 and wherein, for both of the MTJ stacks 14-1, 14-2, the pinned layer 14P is positioned vertically below the free layer 14F. Additional representative layers of insulating material 134, 136, 138 and 140 are shown in FIG. 5. In this embodiment, the inversion or "flipping" of the relative physical orientations of the pinned layer 14P on the MTJ stack 14-2 (relative to the pinned layer 14P on the MTJ stack 14-1) is achieved by the formation of additional metal lines 120 and conductive vias 116 such that the bit line 32-2 is connected to the pinned layer 14P while the free layer 14F of the MTJ stack 14-2 is connected to the drain region 113D of the access transistor 12-2.

Figure 6:
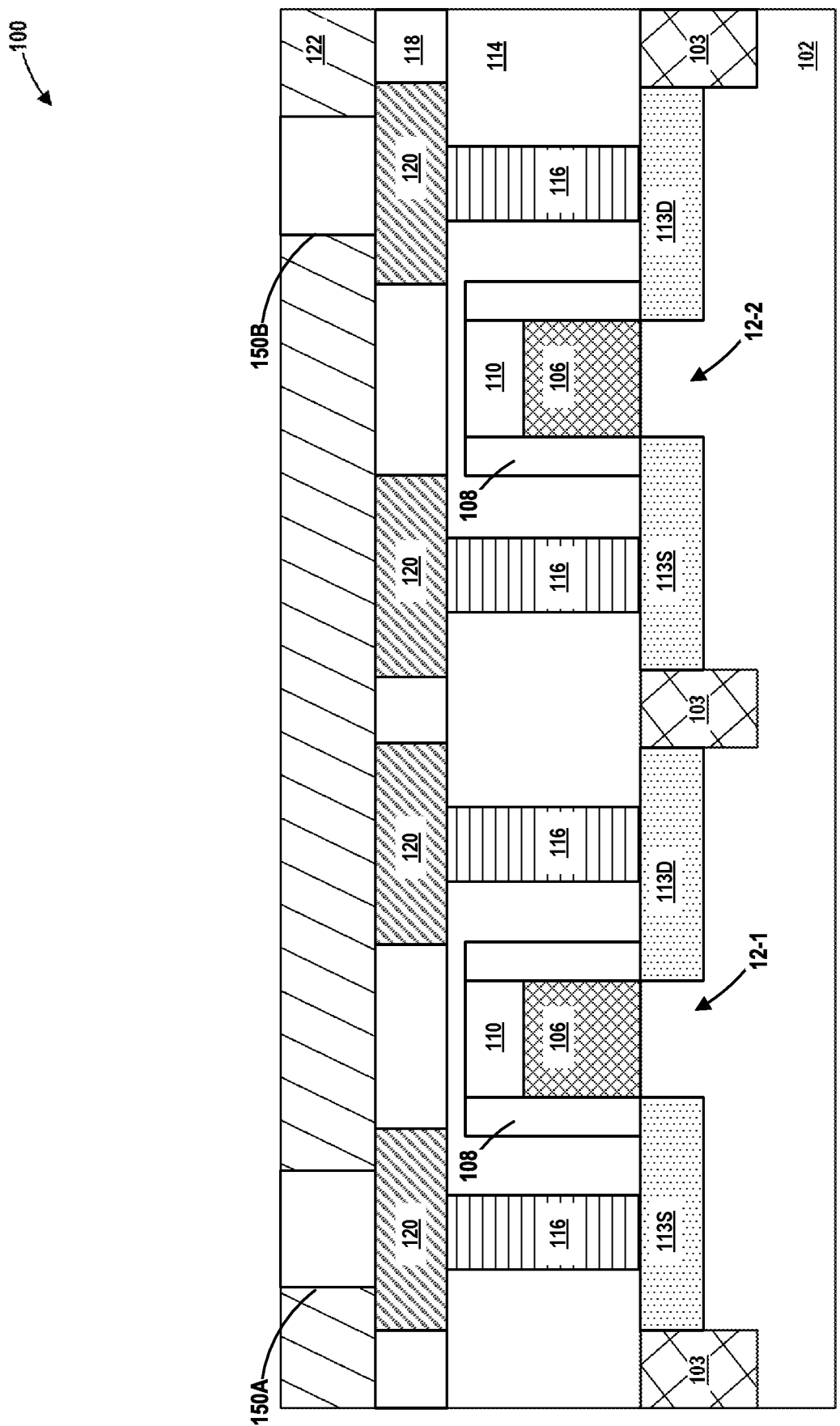

One illustrative process flow for the formation of the embodiment of the MRAM array 30 shown in FIG. 3 will now be described with reference to FIGS. 6-14. FIG. 6 depicts the product 100 after the access transistors 12, the layers of insulating material 114, 118 and 122 were formed on the product 100 and after several of the conductive vias 116 and conductive lines 120 were formed on the product 100. FIG. 6 also depicts the product 100 after openings 150A, 150B (collectively referenced using the numeral 150) were formed in the layer of insulating material 122 by performing known masking and etching techniques.

Figure 7:
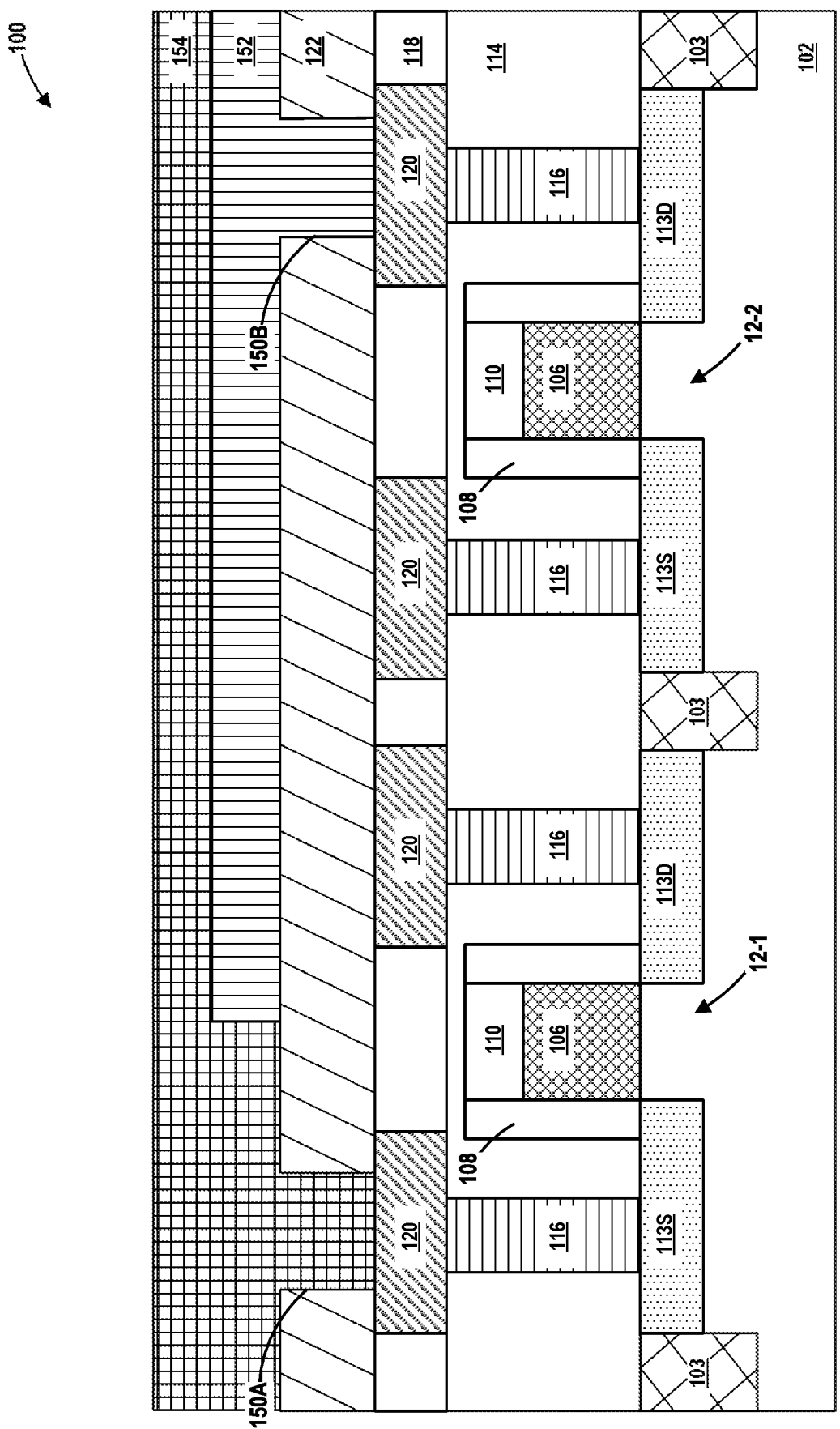

FIG. 7 depicts the product 100 after several process operations were performed. First, a patterned masking layer 152 was formed above the layer of insulating material 122. The patterned masking layer 152 may be formed by depositing a layer of the masking material, e.g., OPL, silicon nitride, etc., and thereafter patterning the deposited layer of masking material by performing known masking and etching techniques. Note that the patterned masking layer 152 fills the opening 150B while leaving the opening 150A exposed for further processing. Thereafter, a layer of ferromagnetic material 154 for the pinned layer 14P of the MTJ stack 14-1 was deposited such that it overfills the opening 150A.

Figure 8:
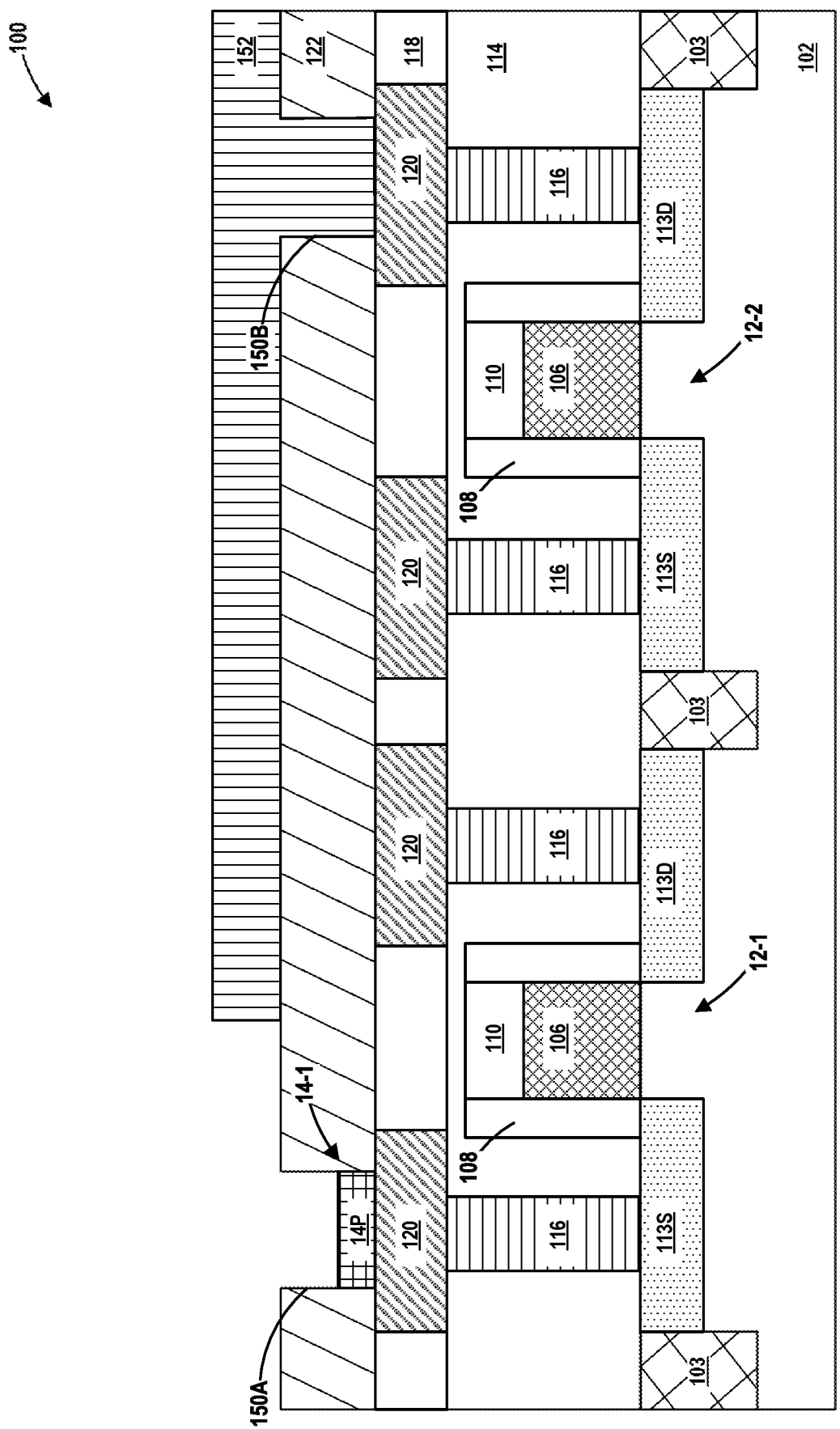

FIG. 8 depicts the product 100 after a timed recess etching process was performed to remove portions of the layer of ferromagnetic material 154 while leaving a portion of the layer or material 154 in the opening 150A so as to form the pinned layer 14P for the MTJ stack 14-1.

Figure 9:
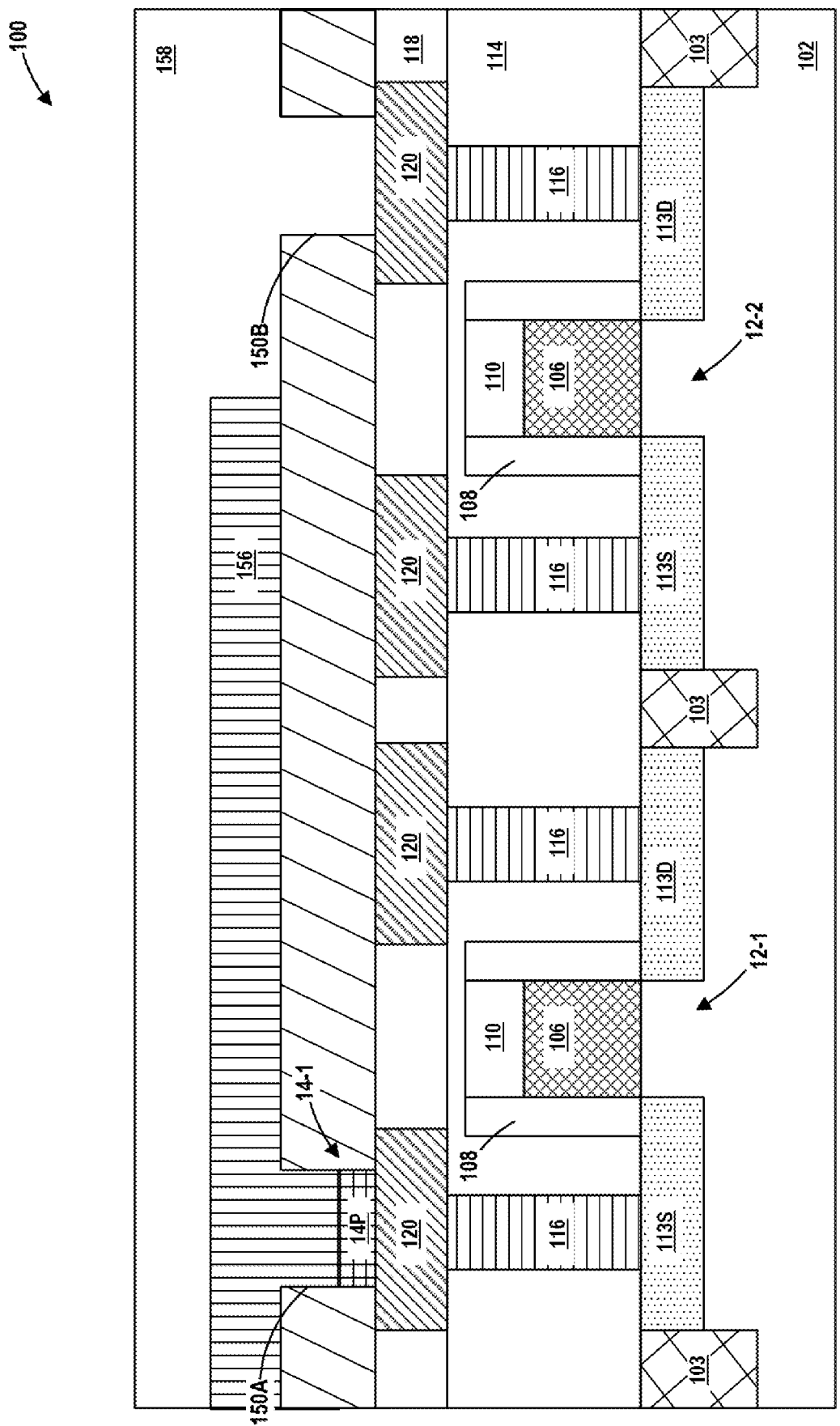

FIG. 9 depicts the product 100 after several process operations were performed. First, the patterned masking layer 152 was removed. Then, another patterned etch mask 156 was formed above the layer of insulating material 122. The patterned masking layer 156 may be formed by depositing a layer of the masking material, e.g., OPL, silicon nitride, etc., and thereafter patterning the deposited layer of masking material by performing known masking and etching techniques. Note that the patterned masking layer 156 fills the unfilled portions of the opening 150A while leaving the opening 150B exposed for further processing. Thereafter, a layer of ferromagnetic material 158 for the free layer 14F of the MTJ stack 14-2 was deposited such that it overfills the opening 150B.

Figure 10:
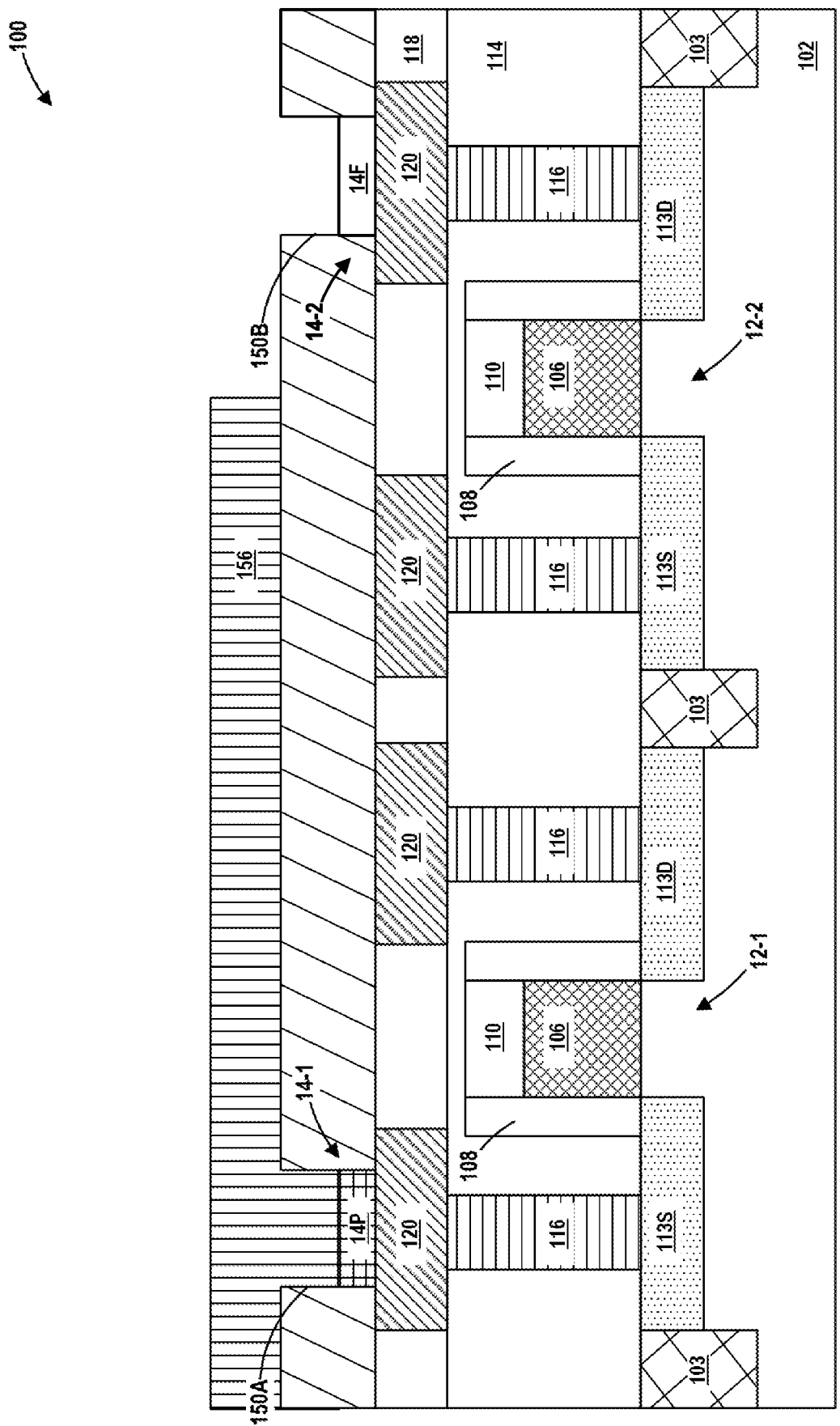

FIG. 10 depicts the product 100 after a timed recess etching process was performed to remove portions of the layer of ferromagnetic material 158 while leaving a portion of the layer or ferromagnetic material 158 in the opening 150B so as to form the free layer 14F for the MTJ stack 14-2.

Figure 11:
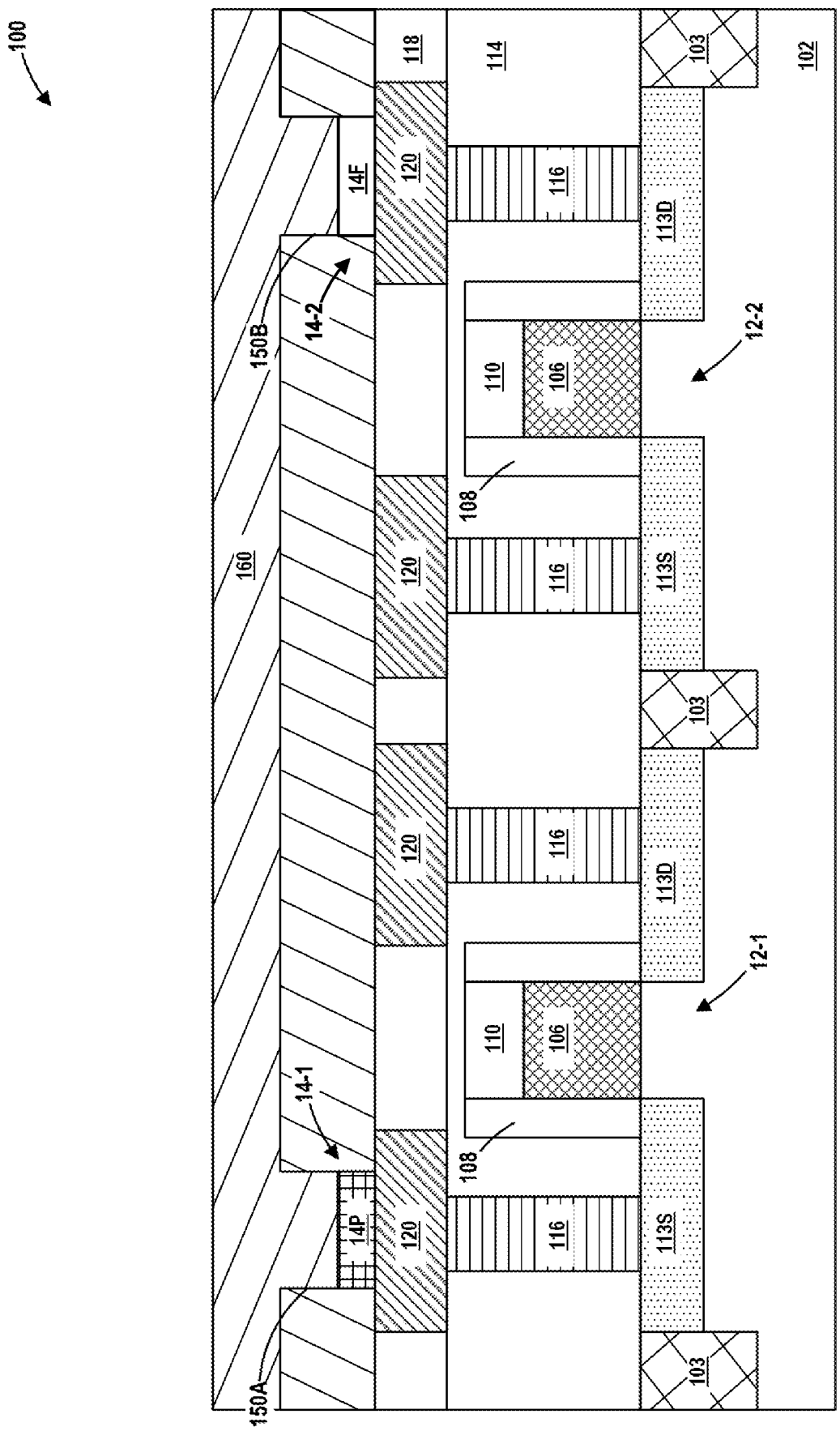

FIG. 11 depicts the product 100 after several process operations were performed. First, the patterned masking layer 156 was removed. Thereafter, a layer of non-magnetic material 160 for the non-magnetic layer 14N of the MTJ stacks 14-1, 14-2 was deposited such that it overfills both openings 150A, 150B.

Figure 12:
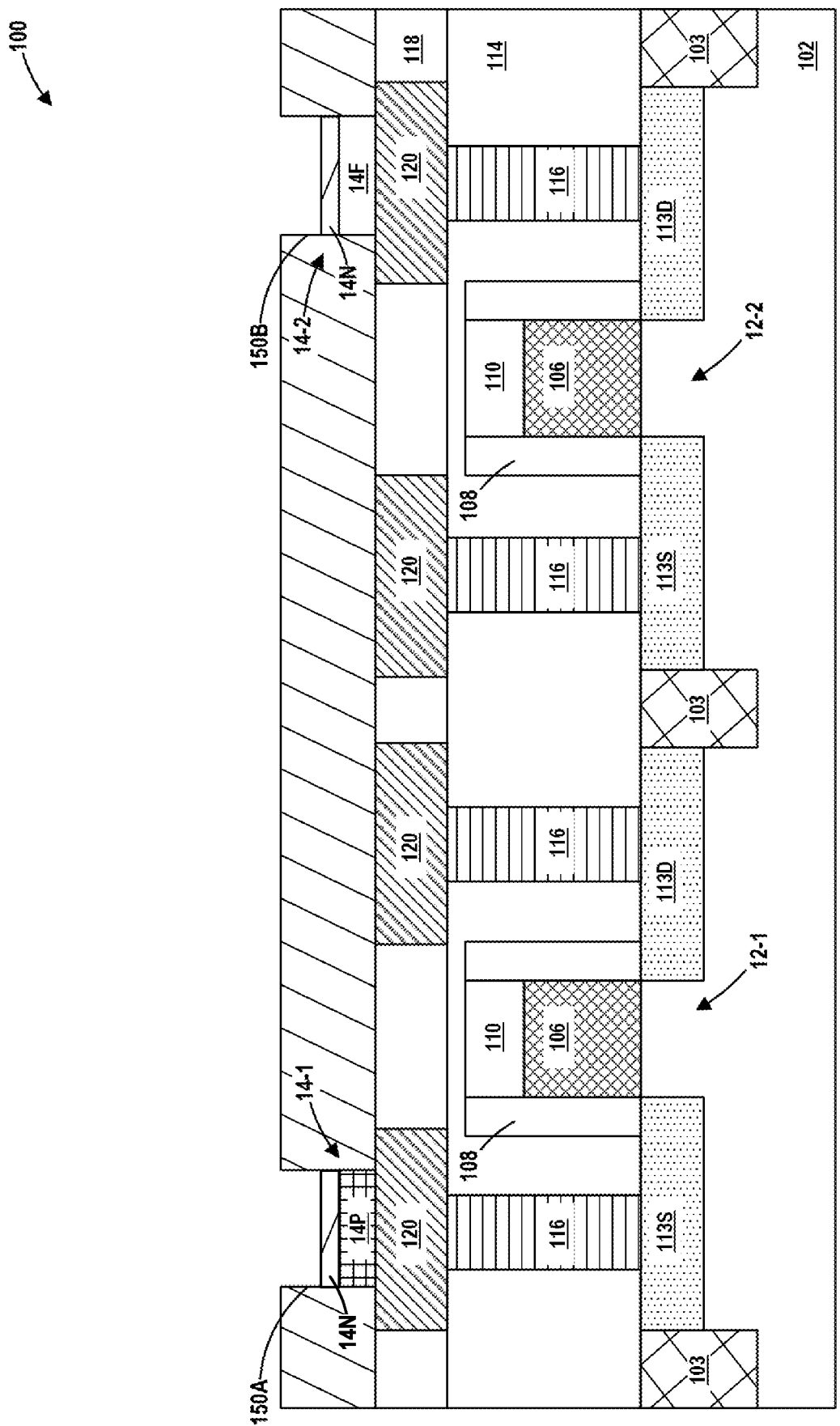

FIG. 12 depicts the product 100 after a timed recess etching process was performed to remove portions of the layer of non-magnetic material 160 while leaving a portion of the layer of non-magnetic material 160 in each of the openings 150A, 150B so as to form the non-magnetic layer 14N for each of the MTJ stacks 14-1, 14-2.

Figure 13:
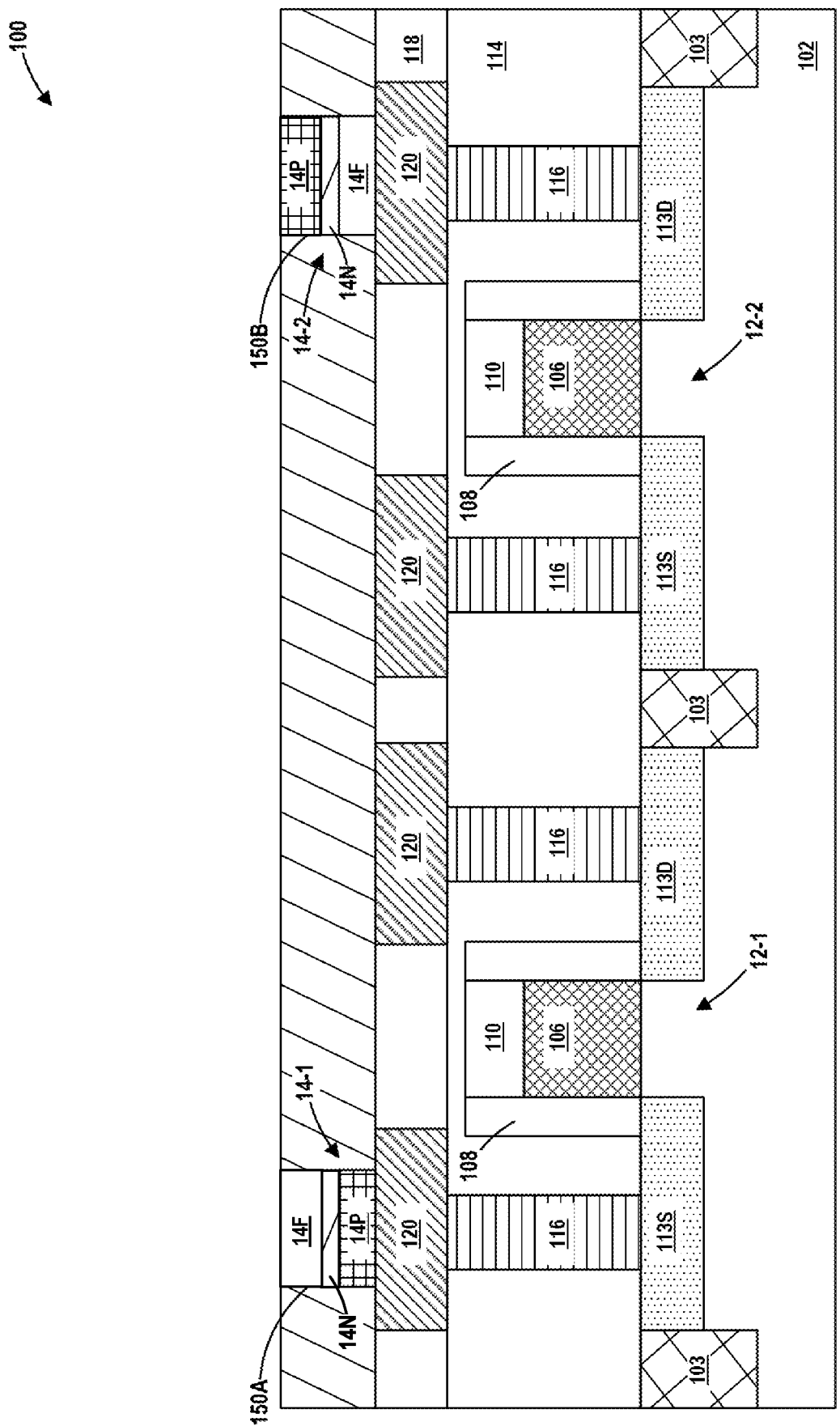

FIG. 13 depicts the product after masking, deposition and etching processes discussed above in connection with FIGS. 7-10 were performed to form the free layer 14F of the MTJ stack 14-1 in the opening 150A and to form the pinned layer 14P of the MTJ stack 14-2 in the opening 150B.

Figure 14:
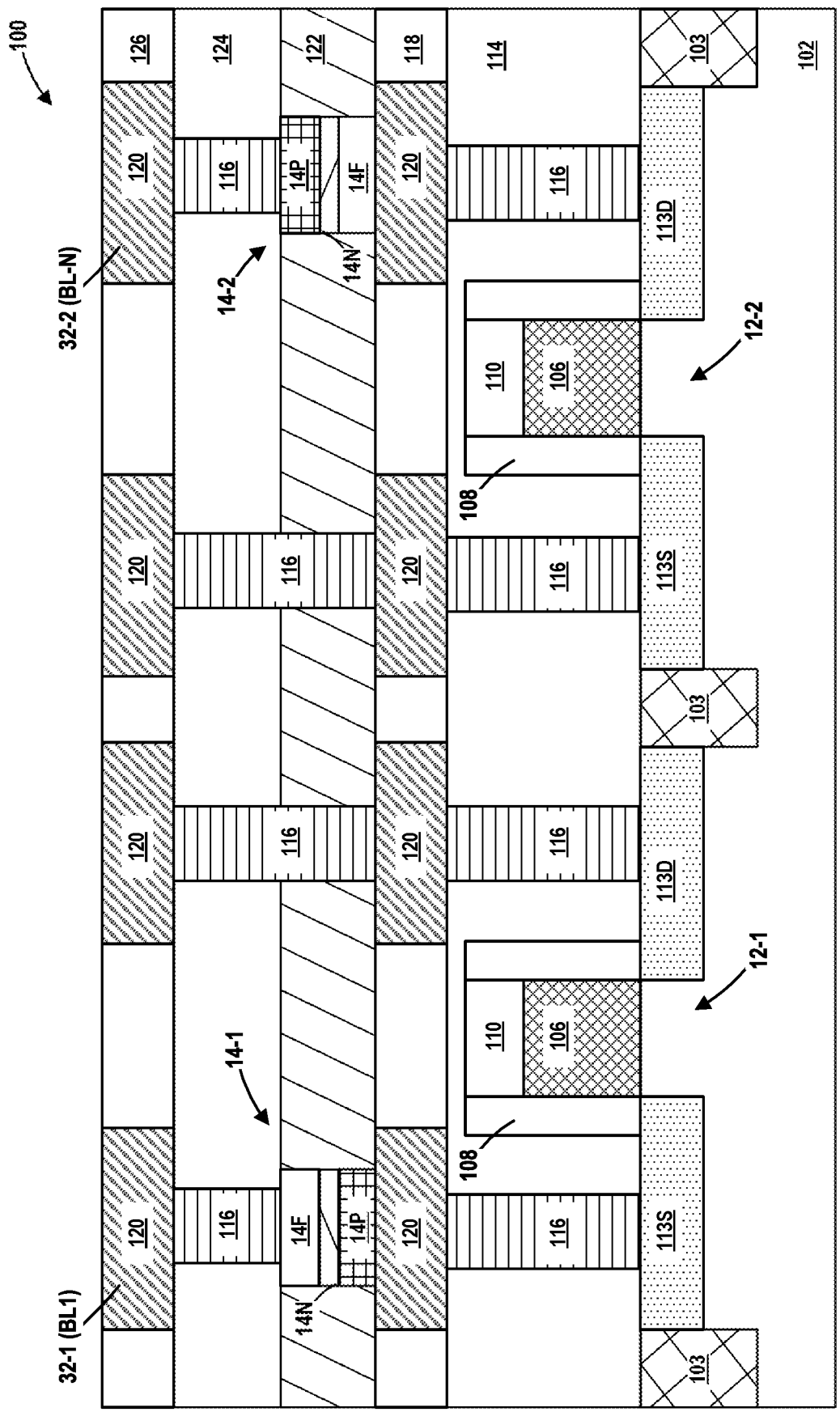

FIG. 14 depicts the product 100 after additional layers of insulating material 124, 126, conductive vias 116 and conductive lines 120 were formed on the product 100. As depicted in FIG. 14, for the MTJ stack 14-1, the pinned layer 14P is positioned vertically below the free layer 14F and the free layer 14F is connected to the bit line 32-1. For the MTJ stack 14-2, the free layer 14F is positioned vertically below the pinned layer 14P and the pinned layer 14P is connected to the bit line 32-2.

Some operational aspects of the MRAM array 30 will now be discussed. The MTJ stack 14 has an energy barrier as a result of an interface anisotropy between the non-magnetic layer 14N and each of the pinned layer 14P and the free layer 14F. The energy barrier maintains the MTJ stack 14 in its two stable states—parallel and antiparallel. A typical STT-based switching technique involves passing a spin polarized current through the free layer 14F to exert a torque on the free layer 14F, thereby flipping the state of the MTJ stack from the parallel state to the antiparallel state, and vice versa, based on the direction of the current. However, this current can be large. The torque has to be sufficiently large so to overcome the energy barrier associated with the free layer 14F that maintains the free layer 14F in a given state.

Figure 15:
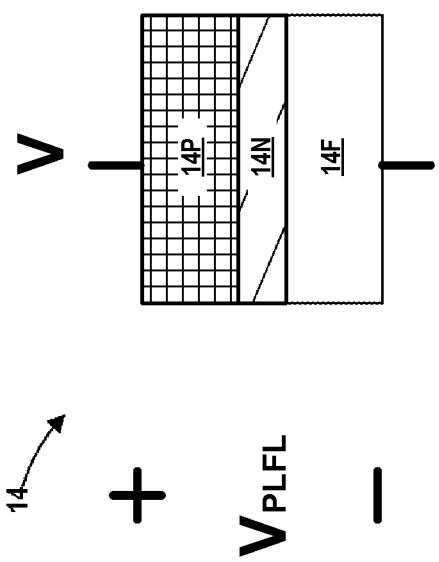

As noted above, a VMCA precessional switching technique may be employed to switch the state of the MTJ stack 14 from parallel to antiparallel and vice versa. The precessional switching approach is used to lower the energy barrier of the MTJ stack 14 thereby making switching easier. The VMCA precessional switching effectively makes the MTJ stack 14 asymmetric with respect to the voltage polarity. More specifically, using the VMCA precessional switching approach, voltage asymmetry changes the interface anisotropy in order to reduce the current requirement when a particular polarity of voltage (positive or negative) is applied across the MTJ stack 14. With reference to FIG. 15, the voltage across the MTJ stack 14 (when the stack is oriented in the manner shown in FIG. 15) will be referred to as the applied voltage ($V_{PLFL}$). When the applied voltage ($V_{PLFL}$) is positive (greater than zero), i.e., with the pinned layer 14P being at higher potential than the free layer 14F, the energy barrier of the MTJ stack 14 is reduced and the MTJ stack 14 can be easily switched. Conversely, if the applied voltage ($V_{PLFL}$) is negative (less than zero), i.e., with the pinned layer 14P at lower potential than the free layer 14F, the energy barrier is increased and the MTJ stack 14 would be difficult to switch. Note, with the polarity of the voltage in a state such that the energy barrier is reduced, the magnetic vector of the MTJ stack 14 would switch through well-known precessional dynamics such that the voltage pulse is applied only for a pre-determined period of time.

Figure 16:
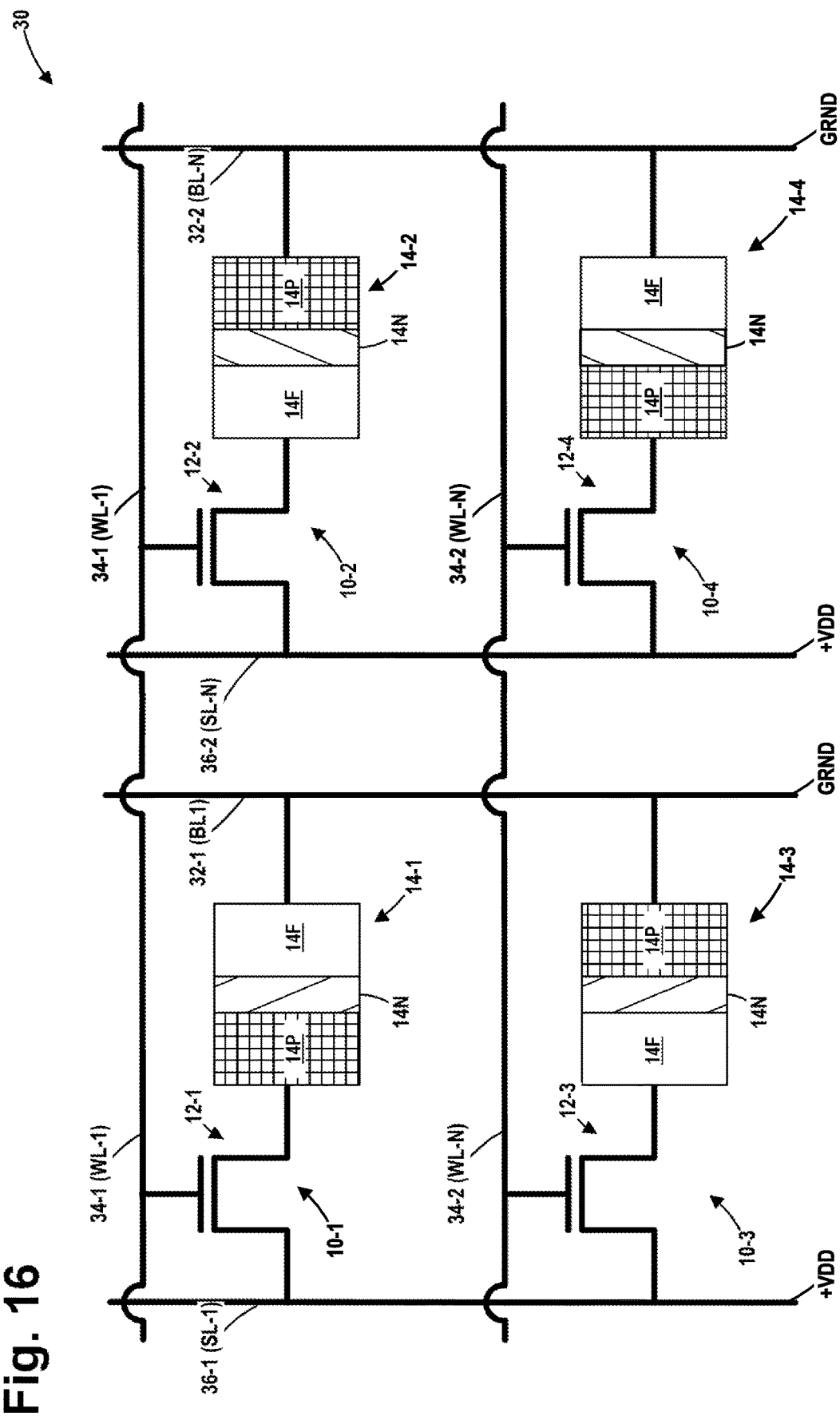

To switch the magnetic orientation of the free layer 14F, a positive switching voltage (+VDD) will be applied to the pinned layer 14P of the MTJ stack 14. Based upon current-day technology, the switching voltage (+VDD) may be on the order of about 300 mV-1 V. FIG. 16 is the same as FIG. 2, except that the switching voltage (+VDD) has been applied to the source lines 36 and the bit lines 32 are connected to ground. When the word line 34-1 is energized, the access transistor 12-1 and 12-2 will both be turned "ON". With the switching voltage (+VDD) applied to the pinned layer 14P of the MTJ stack 14-1 in bit cell 10-1, the magnetic orientation of the free layer 14F of the MTJ stack 14-1 will flip or change from parallel to antiparallel (or vice versa). However, since the voltage across the MTJ stack 14-2 in bit cell 14-2 is negative, i.e., the pinned layer 14P of the MTJ stack 14-2 is at a lower potential (ground) than the free layer 14F (at +VDD), the magnetic orientation of the free layer 14F of the MTJ stack 14-2 will not flip or change, i.e., its state (parallel or antiparallel) prior to the application of the switching voltage (+VDD) will remain unchanged.

For each of the bit cells 10 in a given row of the MRAM array 30, for example, the row containing the bits cells 10-1 and 10-2, there are a first plurality of MTJ stacks (including the MTJ stack 14-1) within that row where the state (parallel or antiparallel) of the MTJ stack will change or switch when subjected to the switching voltage (+VDD) and a second plurality of MTJ stacks (including the MTJ stack 14-2) within that row where the state (parallel or antiparallel) of the MTJ stack will not change or switch when subjected to the switching voltage (+VDD). This is the case due to the physical orientation of the MTJ stacks 14 disclosed herein. That is, for the first plurality of MTJ stacks 14—where the pinned layer 14 is connected to the access transistor (and the free layer 14F is connected to a bit line 32)—the magnetic orientation of the free layer 14F will switch by making a precessional half-cycle when the switching voltage (+VDD) is applied to the pinned layer 14P. Conversely, for the second plurality of MTJ stacks 14—where the free layer 14F is connected to the access transistor 12 (and the pinned layer 14 is connected to a bit line 32)—the magnetic orientation of the free layer 14F will not switch when the switching voltage (+VDD) is applied to the free layer 14F. The same is true for the bit cells 10 in a given column of the MRAM array 30. That is, for each of the bit cells 10 in a given column of the MRAM array 30, i.e., the column containing the bits cells 101 and 10-3, there are a first plurality of MTJ stacks (including the MTJ stack 14-1) within that column where the state (parallel or antiparallel) of the MTJ stack will change or switch when subjected to the switching voltage (+VDD) and a second plurality of MTJ stacks (including the MTJ stack 14-3) within that column where the state (parallel or antiparallel) of the MTJ stack will not change or switch when subjected to the switching voltage (+VDD).

As it relates to VMCA precessional switching, irrespective of whether the initial state of the magnetization vector is pointing in the +z or the −z direction, when a sufficient positive voltage is applied to lower the interface anisotropy (thereby lowering energy barrier of the MTJ stack 14), the magnetization would start precessing around the hard axis, i.e., the in-plane axis. That is, by applying the appropriate positive voltage for the appropriate amount of time (i.e., a voltage pulse), the magnetization vector would complete a half-cycle around the hard-axis, i.e., the in-plane axis. If the magnetization vector initially started from +z direction, it would now be pointing closer to the −z direction. Conversely, if it the initially started from −z direction, it would now be pointing closer to the +z direction. Therefore, irrespective of the initial state of the magnetization vector of the MTJ stack 14, the magnetization direction would always be reversed if the input voltage pulse is clocked such that the magnetization vector has only completed a half-cycle around the hard axis (i.e., the voltage pulse is terminated after a 180 degree rotation). With this approach, simply by applying the correct voltage polarity pulse for the appropriate amount of time results in switching of the MTJ stack 14 and may result in significant efficiency and power savings.

Figure 17:
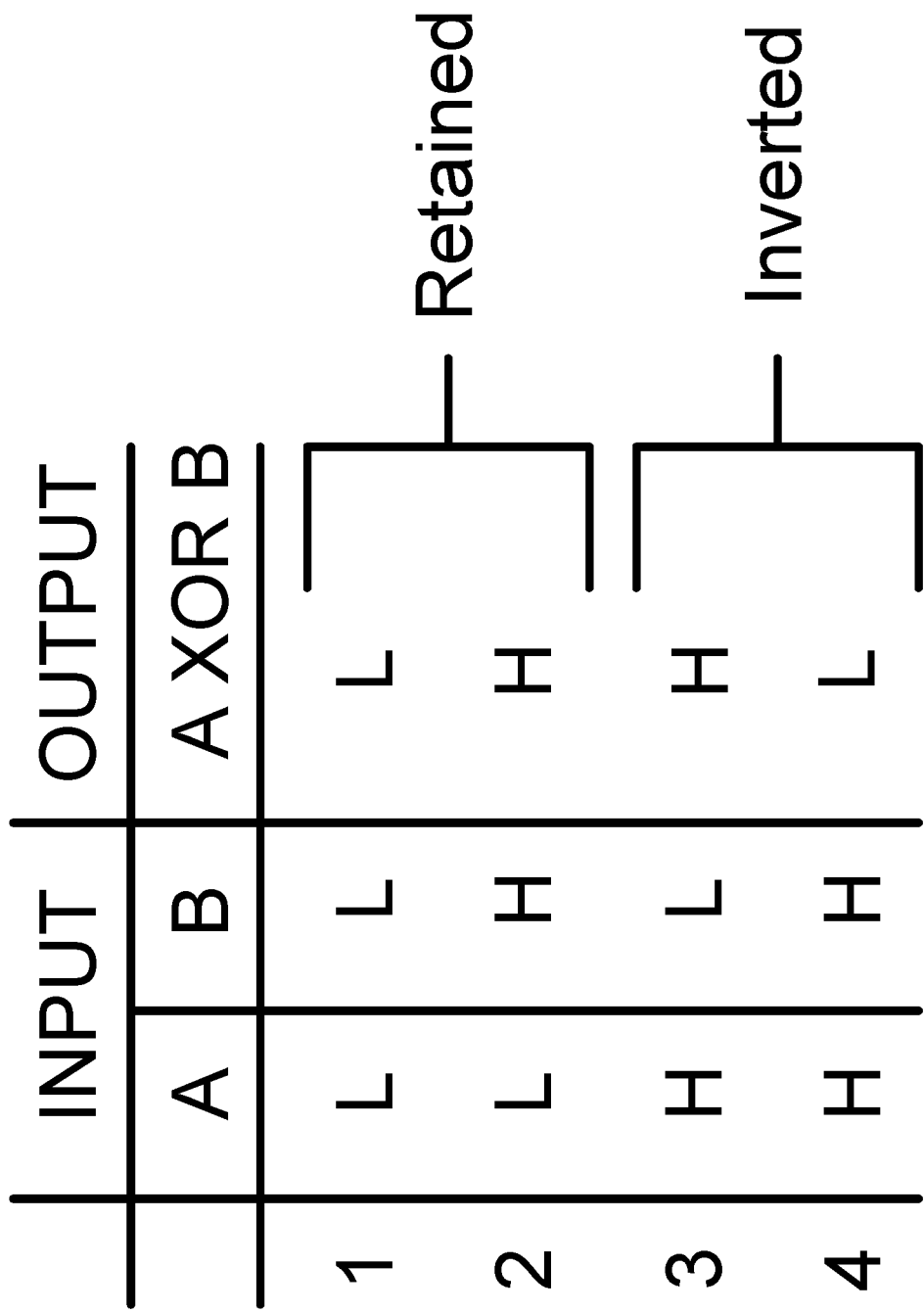
Figure 18:
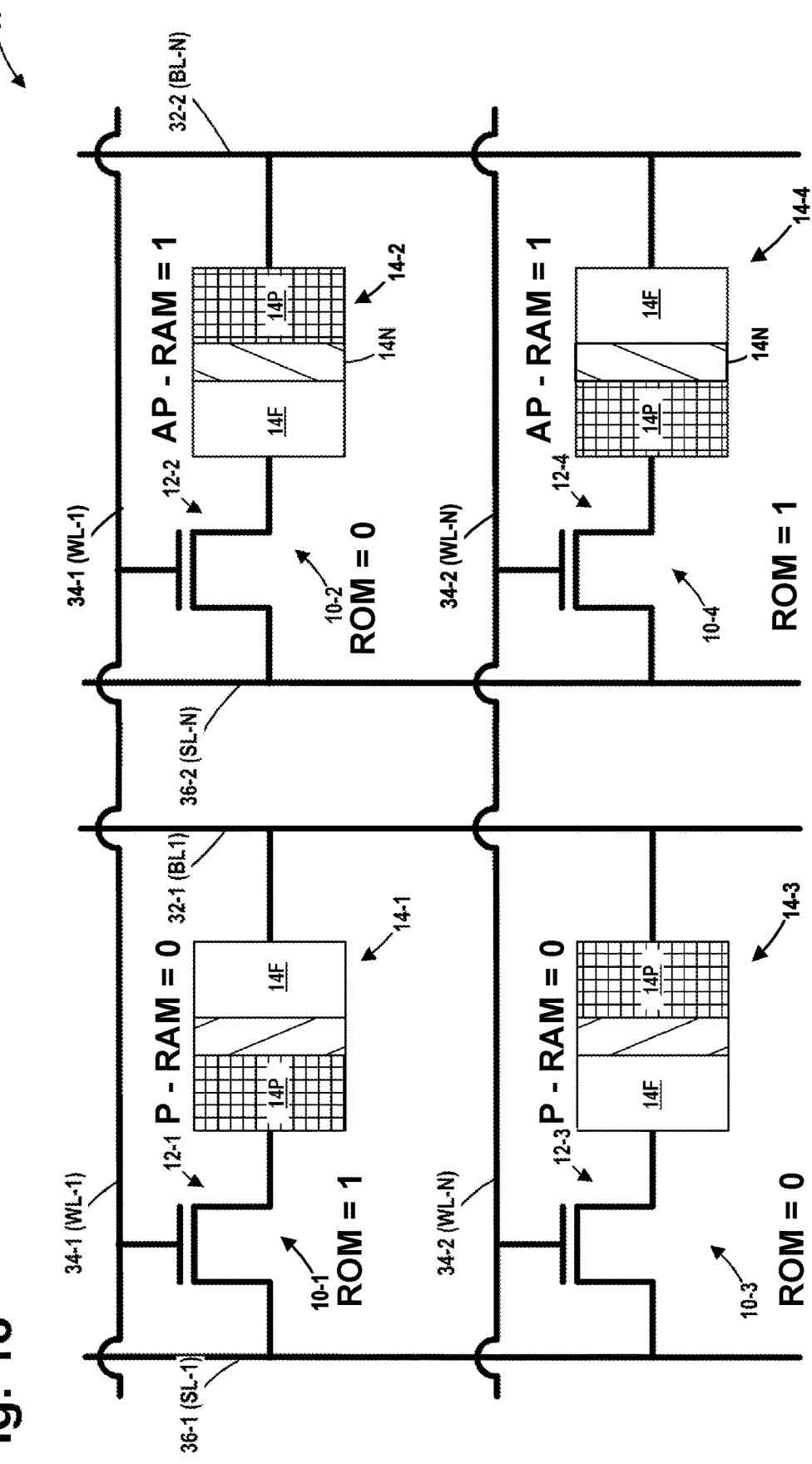
Figure 19:
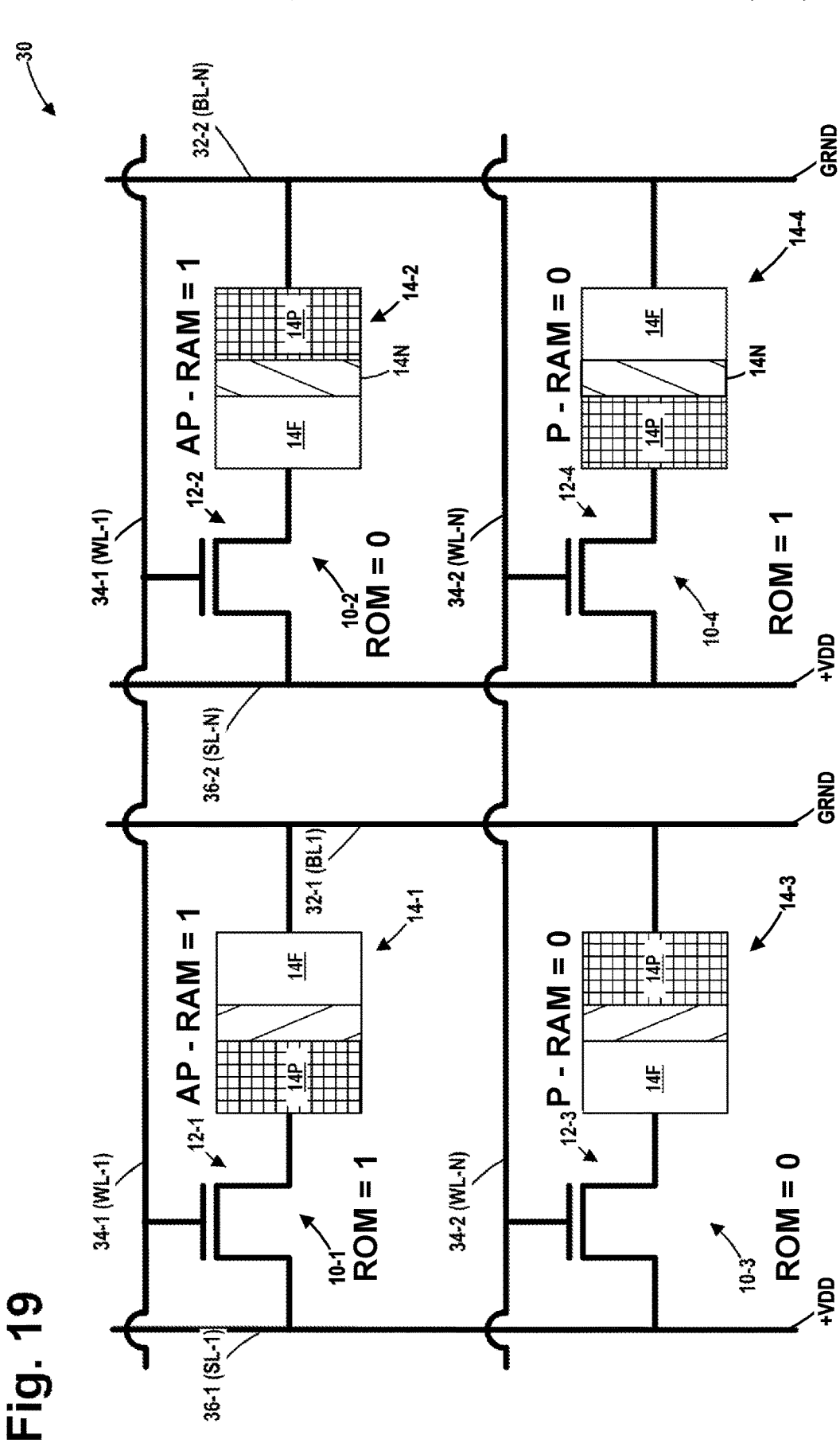

As will be appreciated by those skilled in the art after a complete reading of the present application, various logic computations may be performed within the MRAM array 30 disclosed herein. FIGS. 17-19 depict one illustrative example where an exclusive or (XOR) operation may be performed in the MRAM array 30. Of course, other operations can be performed by those skilled in the art having benefit of the present disclosure, e.g., XNOR. Recall that, within each bit cell 10, RAM data will be stored internally within the MTJ stack 14 while ROM data will be stored in the connection between the access transistor 12 and the MTJ stack 14. In one illustrative embodiment, the parallel orientation of the MTJ stack 14 may represent a logical "0" while the antiparallel orientation of the MTJ stack 14 may represent a logical "1."

FIG. 17 is a truth table for the MRAM array 30 disclosed herein wherein the input "A" corresponds to ROM data, the input B corresponds to RAM, "L" is a logical low value (e.g., "0") and "H" is a logically high value (e.g., "1"). The four possible states of the inputs A and B are shown in the truth table. For the XOR operation, the output (A XOR B) is only high ("H") when the inputs A and B are not alike (see states 2 and 3), otherwise the output is low ("L") (see states 1 and 4). Additionally, for the MRAM array 30 disclosed herein, when the input A is low ("L") (see states 1 and 2), the value of the output (A XOR B) is the same as that of the input B, i.e., the value of B is retained. Conversely, when the input A is high ("H") (see states 3 and 4), the value of the output (A XOR B) is opposite to that of the input B, i.e., the value of B is inverted.

FIG. 18 depicts the MRAM array 30 at a point in time where RAM and ROM data have been previously stored in the bit cells 10-1 through 10-4. No voltages are applied to the bit lines 32, the word lines 34 or the source lines 36 at the point in time depicted in FIG. 18. Recall that RAM data is stored in the MTJ stack 14 of each bit cell 10 and the letter "P" will be used to designate parallel state of the MTJ stack 14, while the letters "AP" will be used to designate that antiparallel state of the MTJ stack 14. Table I below contains the data stored in each of the bit cells 10-1 through 10-4 at the point in time depicted in FIG. 18.

TABLE I

| Bit Cell | ROM | RAM and MTJ Orientation |
|---|---|---|
| 10-1 | 1 (H) | P; 0 (L) |
| 10-2 | 0 (L) | AP; 1 (H) |
| 10-3 | 0 (L) | P; 0 (L) |
| 10-4 | 1 (H) | AP; 1 (H) |

FIG. 19 depicts the MRAM array 30 at a point in time where the switching voltage (+VDD) has been applied to the source lines 36, the bit lines 32 are connected to ground and the word lines 34-1 and 34-2, thereby turning all of the access transistors 12-1 through 12-4 "ON". With the switching voltage (+VDD) applied to the pinned layer 14P of the MTJ stacks 14-1 and 14-4 in bit cells 10-1 and 10-4, respectively, the magnetic orientation of the free layer 14F of the MTJ stack 14-1 will flip or change from parallel (P) to antiparallel (AP) while the magnetic orientation of the free layer 14F of the MTJ stack 14-4 will flip or change from antiparallel (AP) to parallel (P). However, since the voltage across the MTJ stacks 14-2 and 14-3 in bit cells 10-2 and 10-3, respectively, is negative, i.e., the pinned layer 14P of each of these MTJ stacks is at a lower potential (ground) than the free layer 14F (at +VDD), the magnetic orientation of the free layer 14F of the MTJ stacks 14-2, 14-3 will not flip or change. That is, the MTJ stack 14-2 will retain its antiparallel (AP) state that existed prior to the application of the switching voltage (+VDD) and the MTJ stack 14-3 will retain its parallel (P) state that existed prior to the application of the switching voltage (+VDD). Table II below contains the data stored in each of the bit cells 10-1 through 10-4 at the point in time depicted in FIG. 19, wherein the flipped orientation of the MTJ stacks 14-1 and 14-4 has been highlighted by italics, bolding and underlining.

TABLE II

| Bit Cell | ROM | RAM and MTJ Orientation |
|---|---|---|
| 10-1 | 1 (H) | *__AP; 1 (H)__* |
| 10-2 | 0 (L) | AP; 1 (H) |
| 10-3 | 0 (L) | P; 0 (L) |
| 10-4 | 1 (H) | *__P; 0 (L)__* |

As will be appreciated by those skilled in the art after a complete reading of the present application, there are several novel aspects of the MRAM device disclosed herein. For example, in the MRAM array 30 \disclosed herein, the selective flipping of data signifies that the ROM data and the RAM data stored in a given bit-cell 10 have been XORed and the result is stored as the new RAM data in that same bit-cell 10. Thus, the novel MRAM array 30 and novel methods disclosed herein enables in-memory massively parallel bit-wise XOR operation between the RAM and ROM data stored in respective bit cells 10. That is, in addition to near-memory computing (ROM inside RAM), the novel MRAM array 30 and novel methods disclosed herein provide a way to enable in-memory computing of ROM and RAM data together.

With respect to performing read operations on the MRAM array 30, there is no change to reading RAM data as compared to prior art memory arrays. That is, a read voltage ($V_{READ}$) is applied to a source line, a word line is activated, and the RAM data stored in the MTJ stack may be read. In order to read the ROM data, the WL 34 in a particular row is activated and the data stored in the MTJ stack 14 is read. After reading the data in the MTJ stack 14, a write pulse is applied to enable precessional switching and the MTJ stacks 14 that are connected in a manner such that their energy barrier reduces (e.g., those with the pinned layer 14 coupled to the access transistor 12) will have their internal state flipped while those MTJ stacks 14 connected in a manner such that their energy barrier increases (e.g., those where the free layer 14F is connected to the access transistor 12) will not flip. After application of write pulse, the MTJ stacks 14 are read again to see which MTJ stacks 14 in a particular row have flipped. The MTJ stacks 14 that have flipped would represent ROM data "0" and those MTJ stacks 14 that do not flip would represent ROM data "1". Note, once the ROM data is ascertained, the MTJ stacks 14 that were flipped during the write process are switched again to restore them to their initial state.

With respect to performing a write operation on the MRAM array 30, the RAM data stored in MTJ stack 14 is first read then a write pulse is applied if the data has to be reversed. The write pulse will end up flipping those MTJ stacks 14 that are connected in a manner such that their energy barrier decreases. For the remaining MTJ stacks 14 that need to be switched, a write pulse of opposite polarity will be applied to those MTJ stacks 14 so that their energy barrier decreases, and their internal state can be flipped. Thus, a write operation is accomplished for the RAM data stored in the MTJ stacks 14.

Thus, as will be appreciated by those skilled in the art after a complete reading of the present application, the novel MRAM array 30 provides an effective means to perform in-memory computations, thereby reducing the amount of data that must be transferred from a traditional memory array to a logic unit, e.g., a processor. Moreover, since the MTJ stacks 14 in the MRAM array 30 are only connected to a single bit line, the MRAM array 30 is very efficient in that it consumes less plot space as compared to some prior art memory arrays.

One illustrative MRAM array or device disclosed herein comprises a first bit cell and a second bit cell. The first bit cell comprises a first access transistor and a first memory element, wherein the first memory element is arranged in a first orientation relative to the first access transistor. The second bit cell comprises a second access transistor and a second memory element, wherein the second memory element is arranged in a second orientation relative to the second access transistor, wherein the second orientation of the second memory element is opposite to the first orientation of the first memory element in the first bit cell. In one particular example, each of the first and second memory elements comprise a first connection point and a second connection point. In this embodiment, the first connection point of the first memory element is connected to the first access transistor while the second connection point of the second memory element is connected to the second access transistor.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

The invention claimed is:

1. An MRAM array, comprising:
   a first bit cell, the first bit cell comprising:
      a first access transistor; and
      a first MTJ stack, the first MTJ stack comprising a first pinned layer and a first free layer, wherein the first pinned layer is connected to the first access transistor; and
   a second bit cell, the second bit cell comprising:
      a second access transistor; and
      a second MTJ stack, the second MTJ stack comprising a second pinned layer and a second free layer, wherein the second free layer is connected to the second access transistor,
   wherein the first bit cell and the second bit cell are positioned in a first row of the MRAM array, and wherein the MRAM array further includes:
   first and second source lines;
   first and second bit lines; and
   a first word line,
   wherein the first free layer in the first bit cell is connected to the first bit line, the second pinned layer in the second bit cell is connected to the second bit line, the first access transistor in the first bit cell is connected to the first source line, the second access transistor in the second bit cell is connected to the second source line, a gate of the first access transistor is connected to the first word line and a gate of the second access transistor is connected to the first word line.

2. The MRAM array of claim 1, wherein the first access transistor is an NFET transistor and the second access transistor is an NFET transistor.

3. An MRAM array, comprising:
   a first bit cell, the first bit cell comprising:
      a first access transistor; and
      a first memory element, wherein the first memory element is arranged in a first orientation relative to the first access transistor; and
   a second bit cell, the second bit cell comprising:
      a second access transistor; and
      a second memory element, wherein the second memory element is arranged in a second orientation relative to the second access transistor, wherein the second orientation is opposite to the first orientation,
   wherein each of the first and second memory elements includes a respective first connection point and a respective second connection point, wherein the first connection point of the first memory element is connected to the first access transistor and wherein the second connection point of the second memory element is connected to the second access transistor,
   wherein the first bit cell and the second bit cell are positioned in a first row of the MRAM array, and wherein the MRAM array further comprises:

first and second source lines;
first and second bit lines; and
a first word line, wherein the second connection point of the first memory element in the first bit cell is connected to the first bit line, the first connection point in the second memory element in the second bit cell is connected to the second bit line, the first access transistor in the first bit cell is connected to the first source line, the second access transistor in the second bit cell is connected to the second source line, a gate of the first access transistor is connected to the first word line and a gate of the second access transistor is connected to the first word line.

4. The MRAM array of claim 3, wherein the first access transistor is an NFET transistor and the second access transistor is an NFET transistor.

5. The MRAM array of claim 3, wherein the first memory element is a first MTJ stack and the second memory element is a second MTJ stack, each of the first MTJ stack and the second MTJ stack including a respective pinned layer and a respective free layer.

6. The MRAM array of claim 5, wherein the second connection point of the first memory element is the free layer of the first MTJ stack, and the first connection point of the second memory element is the pinned layer of the second MTJ stack.

7. An MRAM array, comprising:
a first bit cell, the first bit cell comprising:
  a first access transistor; and
  a first memory element, wherein the first memory element is arranged in a first orientation relative to the first access transistor; and
a second bit cell, the second bit cell comprising:
  a second access transistor; and
  a second memory element, wherein the second memory element is arranged in a second orientation relative to the second access transistor, wherein the second orientation is opposite to the first orientation,
wherein each of the first and second memory elements includes a respective first connection point and a respective second connection point, wherein the first connection point of the first memory element is connected to the first access transistor and wherein the second connection point of the second memory element is connected to the second access transistor,
wherein the first bit cell and the second bit cell are positioned in a first column of the MRAM array, and wherein the MRAM array further comprises:
a first source line;
a first bit line; and
first and second word lines, wherein the second connection point of the first memory element in the first bit cell is connected to the first bit line, the first connection point of the second memory element in the second bit cell is connected to the first bit line, the first access transistor in the first bit cell is connected to the first source line, the second access transistor in the second bit cell is connected to the first source line, a gate of the first access transistor is connected to the first word line and a gate of the second access transistor is connected to the second word line.

8. The MRAM array of claim 7, wherein the first access transistor is an NFET transistor and the second access transistor is an NFET transistor.

9. The MRAM array of claim 7, wherein the first memory element is a first MTJ stack and the second memory element is a second MTJ stack, each of the first MTJ stack and the second MTJ stack including a respective pinned layer and a respective free layer.

10. The MRAM array of claim 9, wherein the second connection point of the first memory element is the free layer of the first MTJ stack, and the first connection point of the second memory element is the pinned layer of the second MTJ stack.

* * * * *